(12) United States Patent
Yamaguchi et al.

(10) Patent No.: US 6,496,749 B1
(45) Date of Patent: Dec. 17, 2002

(54) SEMICONDUCTOR PRODUCING APPARATUS AND TEMPERATURE CONTROL METHOD THEREFOR

(75) Inventors: Hideto Yamaguchi, Tokyo (JP); Kazuo Tanaka, Tokyo (JP); Kenzo Urabe, Tokyo (JP)

(73) Assignee: Kokusai Electric Co., Ltd., Tokyo (JP)

( * ) Notice: Subject to any disclaimer, the term of this patent is extended or adjusted under 35 U.S.C. 154(b) by 0 days.

(21) Appl. No.: 09/413,467

(22) Filed: Oct. 6, 1999

(30) Foreign Application Priority Data

Oct. 7, 1998 (JP) .......................... 10-285426
Oct. 1, 1999 (JP) .......................... 11-282197

(51) Int. Cl.$^7$ ............................................. G06F 19/00
(52) U.S. Cl. ..................... 700/121; 700/117; 700/28; 700/29; 700/30; 700/41; 700/42; 702/99; 702/130; 702/136; 219/483; 219/486; 219/494; 219/501; 438/660; 438/795; 438/799
(58) Field of Search ..................... 700/28–29, 299–300, 700/30, 31, 32, 41–46, 55, 117–121, 207–211, 278; 219/481–483, 486, 494, 497, 416, 501; 702/130–136, 99; 438/482, 660, 684, 770, 795–799; 318/561, 568.22, 568.17, 631–632, 571, 590

(56) References Cited

U.S. PATENT DOCUMENTS 4,998,051 A * 3/1991 Ito ............................. 318/561
5,001,327 A * 3/1991 Hirasawa et al. ........... 118/729
5,034,312 A * 7/1991 Saito .......................... 430/569
5,131,074 A * 7/1992 Nakamura et al. ............ 706/52
5,387,557 A * 2/1995 Takagi ....................... 29/25.01
5,448,147 A * 9/1995 Kasai .................... 318/568.17
5,500,388 A * 3/1996 Niino et al. ................. 438/482
5,616,264 A * 4/1997 Nishi et al. .................. 219/483
5,813,851 A * 9/1998 Nakao .......................... 432/152
5,875,416 A * 2/1999 Kanno ......................... 702/130
6,222,164 B1 * 4/2001 Stoddard et al. ............ 219/481
6,329,643 B1 * 12/2001 Suzuki et al. ............... 219/497

* cited by examiner

*Primary Examiner*—Ramesh Patel
(74) *Attorney, Agent, or Firm*—McGinn & Gibb, PLLC

(57) ABSTRACT

A semiconductor producing apparatus is capable of quickly and accurately changing a controlled variable to a target value to thereby make the controlled variable quickly follow the target value. Moreover, the controlled variable and target value can be adjusted automatically, thus improving the productivity of a process. The semiconductor producing apparatus includes a PID adjustment section to which a target value and a detected control value are inputted through an adder, a pattern generation section having an approximate function for calculating a pattern output and making it possible to change the pattern output in accordance wit parameter values of the approximate function, and a switcher for switching between an output including at least an output of the pattern generation section and an output of the PID adjustment section to thereby generate an output.

33 Claims, 22 Drawing Sheets

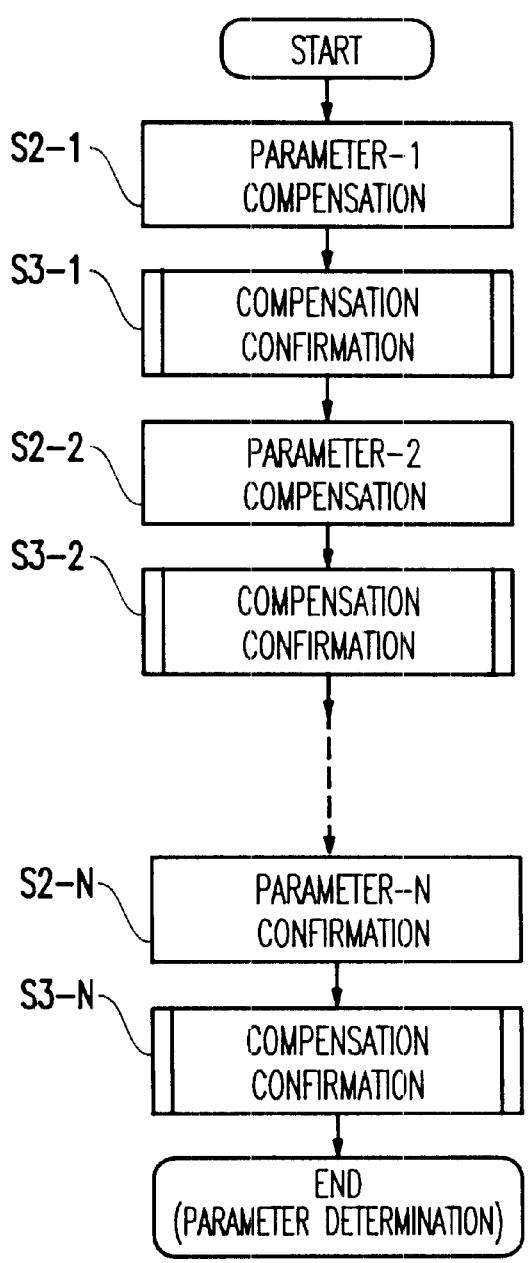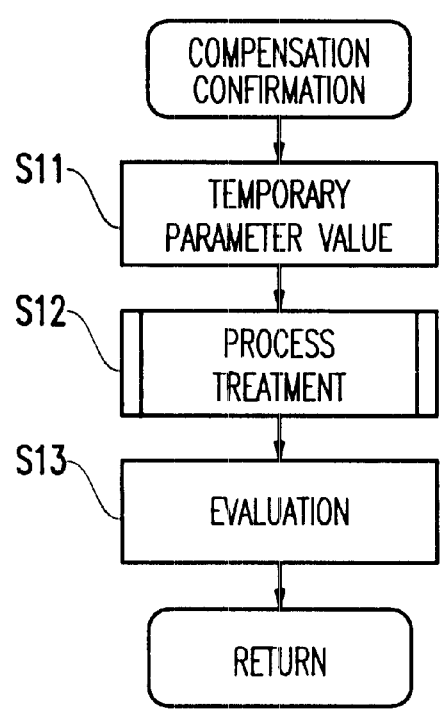
FIG.4A
FIG.4B

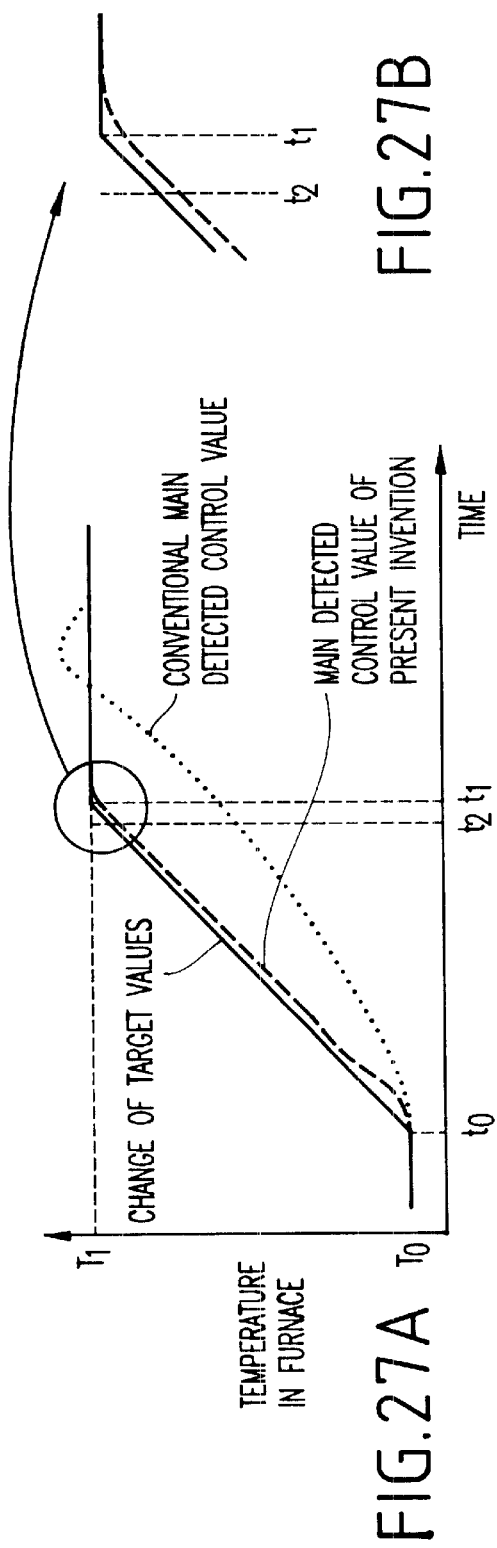
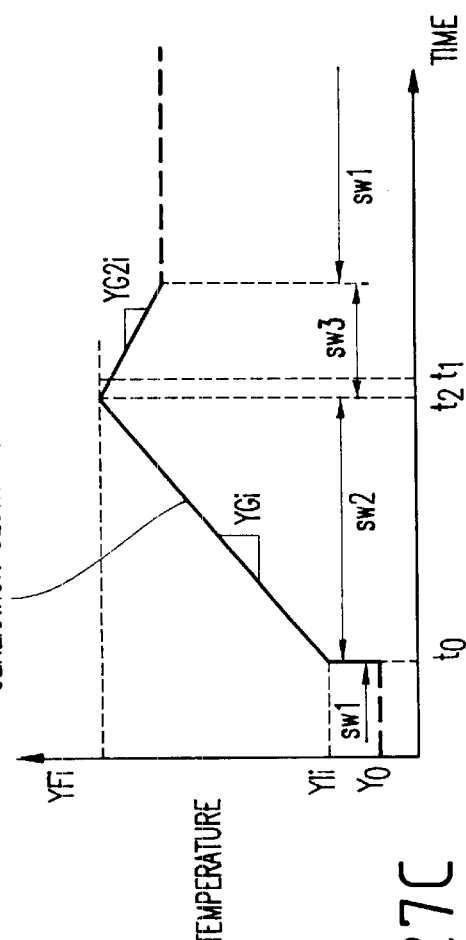
FIG.27A
FIG.27B
FIG.27C

SEMICONDUCTOR PRODUCING APPARATUS AND TEMPERATURE CONTROL METHOD THEREFOR

BACKGROUND OF THE INVENTION

1. Field of the Invention

The present invention relates to a semiconductor producing apparatus equipped with a heat treatment device such as a diffusion devices a CVD, etc., capable of heat-treating semiconductor wafers in batches, and it also relates to a temperature control method for such a semiconductor producing apparatus.

2. Description of the Related Art

In a heat treatment device for a semiconductor producing apparatus such as a diffusion device, a CVD, etc., having an electric furnace for example, it is necessary to maintain the temperature of the electric furnace at an appropriate temperature, or make the interior of the electric furnace follow a dictated temperature change. Such a temperature control is required to have high precision or high performance with respect to compensation against external disturbances, and followability against a change in a target temperature. Conventionally, a control method as illustrated in FIG. 28 for example has been used for the temperature control on such a heat treatment device.

The control method of FIG. 28 employs an adder 1 having a target temperature input end IN and outputting a deviation or diference between a target temperature inputted to the target temperature input end IN and a detected temperature (controlled quantity or variable) from a heat treatment furnace 3 to be described later, a PID adjuster in the form of a PID adjustment section 2 provided at an output side of the adder 1 for performing PID calculations (e.g., proportioning, integrating and differentiating calculations) based on an output of the adder 1 and outputting a manipulated quantity or variable for the heat treatment furnace or device 3 thus calculated, and the heat treatment furnace 3 provided at an output side of the PID adjustment section 2 and having an input end a for receiving an output of the PID adjustment season 2 as a manipulated variable and an output end h for outputting the detected temperature (controlled variable), whereby the detected temperature (controlled variable) outputted from the output end b of the heat treatment furnace 3 can be controlled to a desired value.

The PID adjustment section 2 may include, as required, a known function of coping with integration anti-wind-ups or bumpless technique. The heat treatment furnace 3 among various components of FIG. 28 is schematically configured as illustrated in FIGS. 29(a) for example. Specifically, the heat treatment furnace 3 of FIG. 29(a) includes an electric furnace 31 having an input end a for inputting a manipulated quantity or variable, an output end b for outputting a controlled variable and an introduction port through which semiconductor wafers are to be introduced or loaded into the electric furnace 31, a boat 32 for holding the semiconductor wafers in the electric furnace 31, a cap 33 for closing the introduction port of the electric furnace 31 and supporting the boat 32, a heater 34 adapted to be supplied, though not shown, with electric power in response to a control signal from the input end a to heat the interior of the electric furnace 31, and a temperature sensor 35 for detecting the temperature of the interior of the electric furnace 31 and outputting the detected temperature to the output end b, whereby the interior temperature of the electric furnace 31 is controlled to follow or maintain a specific temperature pattern, thus chemically processing the semiconductor wafers held by the boat 32.

Also, for the purpose of temperature control, the electric furnace 31 as representatively illustrated in FIGS. 20(a) and 29(b) has a heating element divided into a plurality of heating zones to each of which electric power is supplied independently of each other to control the temperature thereof. For example, in the case of FIG. 29(a), the heating element takes, if divided into four zones, such a configuration as shown in FIG. 30.

Similar to FIG. 29(a), the heat treatment furnace 3A of FIG. 30 includes, as its constructional components, an electric furnace 31, a boat 32, a cap 33 and a heater 44. The heater 44, being divided into four sections, is constructed such that it is provided with four manipulated variable input ends a1 through a4, a temperature sensor 45 for measuring the temperatures of the respective four-divided zones, and four controlled variable output ends b1 through b4 corresponding to the four zones a1 through a4, respectively.

In the following description, a collection of components provided in a route extending from the manipulated variable input end a1 to the controlled variable output end b1 may be designated at zone 1, and similarly, another collection of components in another route from a2 to b2, a further collection of components in a further route from a3 to b3 and so on may be respectively designated at zone 2, zone 3 and so on.

In the case of a heat treatment furnace of the configuration having a plurality of heating zones, for example four-divided zones as illustrated in FIG. 30, there has often been used a control scheme in which the configuration of FIG. 28 is simply formed into a plurality of heating zones in parallel with each other, as illustrated in FIG. 31. The heat treatment furnace 3A among the components of FIG. 31 has four manipulated variable input ends at through a4 and four manipulated variable output ends b1 through b4, as shown in FIG. 30. Here, reference symbols 1-1 through 1-4 designate a plurality of parallel adders, and reference symbols 2-1 through 2-4 designate a plurality of parallel PID adjustment sections.

The heat treatment furnaces as illustrated in FIGS. 30 and 31 carry out a process treatment in accordance with a temperature control procedure as shown in FIGS. 32(a) and 32(b) for example.

Here, a description will be made of an example of the process treatment carried out by such a conventional heat treatment furnace described above, while referring to FIGS. 32(a) and 32(b). FIG. 32(a) is a flowchart illustrating such an example of heat treatment carried out by the above-mentioned heat treatment furnace, and FIG. 32(b) schematically shows the temperature of the heat treatment furnace during the heat treatment. In FIG. 32(b), symbols designate processings indicated by the same symbols in FIG. 32(a).

In FIG. 32(a), a step S101 is to maintain and stabilize the temperature in the interior of the electric furnace 31 at a relatively low temperature $T_0$. In step S101, the boat 32 has not yet been introduced into the electric furnace 31. A step 8102 is to introduce or load the boat 32 holding semiconductor wafers into the electric furnace 31. As a result of the boat 32 having been loaded into the electric furnace 31, due to the fact that the semiconductor wafers are generally lower in temperature than the temperature $T_0$ of the electric furnace 31, the temperature of the electric furnace 31 temporally becomes lower than the temperature $T_0$, but it is restored and stabilized to that temperature $T_0$ in a certain period of time under the above-described temperature control.

A step S103 is to gradually raise the temperature of the electric furnace 31 from the temperature $T_0$ to a temperature $T_1$, which is suitable for a process treatment such as a film forming treatment on the semiconductor wafers (e.g., forming a thin layer or film on each semiconductor wafer). A step S104 is to maintain and stabilize the Interior temperature of the electric furnace 31 at the temperature $T_1$ in order to perform a process treatment on the semiconductor wafers. A step S105 is to gradually lower, after the process treatment having been finished, the temperature of the electric furnace 31 from the temperature $T_1$ to the relatively lower temperature $T_0$. Thereafter, a step S106 is carried out which is to take the boat 32 holding the process-treated semiconductor wafers out of the electric furnace 31 for replacement of the process-treated wafers with new untreated wafers. All of these series of processings from step S101 to step S106 are then performed on all the untreated wafers.

When all the semiconductor wafers have been subjected to the process treatment, the series of temperature control is finished but otherwise, the semiconductor wafers on the boat having been process-treated are replaced with new untreated wafers, and the flow or process is again returned to the step S101, and the processings from step S101 to S106 are again repeated. Here, note that the processings in steps S101, S102, S104 and S106 are allowed to proceed to the following steps, respectively, after a stable state of temperature is attained in which the interior temperature of the electric furnace 31 is in a predetermined limited temperature range with respect to the target temperature and such a temperature condition continues for a predetermined period of time.

With the use of the conventional temperature control system and method as described above and illustrated in FIG. 28 or FIG. 31, however, there arises the following problem. Specifically, in the event that the target temperature rapidly changes, it becomes impossible to maintain the detected temperature (controlled variable), giving rise to a delay in the process of the controlled variable to follow the target value, as a consequence of which it takes a long time until the controlled variable reaches an allowable range with respect to the target value, thus attaining a stable state.

For example, it is necessary to finish in a short period of time the step S103 in the process treatment as illustrated in FIGS. 32(a) and 32(b) in order to enhance the time-related production efficiency of the entire heat treatment system. For this reason, it is desired to increase the rising speed of the target value, so the delay in following the target value according to the conventional temperature control system and method as referred to above becomes too great to be ignored.

In order to solve this problem, there has been known another method which is capable of improving the followability without impairing control preciseness by performing control according to a configuration as shown in FIG. 33.

The control blocks shown in FIG. 33 includes, as like components of FIG. 28, a target value input end IN, an adder 1, a PID adjustment section 2 and a heat treatment furnace 3, and as different components therefrom, a pattern generator in the form of a pattern generation section 5 for outputting, as a controlled variable for the heat treatment furnace 3, an optimal signal which is deemed suited as such, a switch in the form of a switcher 6 for selecting either one of an output of the PID adjustment section 2 and an output of the pattern generation section 5 in response to a switch control signal and outputting it as a manipulated variable, and a switch control section 7 for supervising the output of the adder 1 and outputting a switch control signal to control the switcher 6 in correspondence with a specific condition (e.g., a later-mentioned predetermined point of time, or a later-mentioned change in the output of the adder 1 exceeding a predetermined value), whereby the detected temperature (controlled variable) outputted from the output end b of the heat treatment furnace 3 is properly controlled. The pattern generation section 5 and the switch control section 7 each incorporate therein a clock timed to indicate the same time point and store a period of time from the beginning of temperature control to the time when a rapid change in the target value has occurred, from which one can know the exact time point of such a rapid change.

In the control method carried out by the control blocks shown in FIG. 33, feed-back control is carried out on the target temperature from the target input end IN and the detected temperature (controlled variable) from the output end b of the heat treatment furnace 3, which is a control target, by means of the adder 1 and the PID adjustment section 2. When an abrupt change in the target value from the target input end IN takes place, the switch control section 7 outputs a switch control signal to the switcher 6, whereby the output of the switcher 6 is switched from the PID adjustment section 2 side to the pattern generation section 5 side. As a result, open loop control is started in accordance with the output of the pattern generation section 5. At a predetermined point in time at which the output of the adder 1 again becomes nearly zero, the switch control section 7 outputs a switch control signal to the switcher 6 again, so that the output of the switcher 6 is switched over from the pattern generation section 5 side to the PID adjustment section 2 output side, thus resuming feed-back control.

More specifically, according to the control method shown in FIG. 33, when the target value has abruptly changed as in step S103 of the process treatment of FIGS. 32(a) and 32(b) for example, the switch control section 7 expects or forecasts the time point of such an abrupt change beforehand, and switches, at the expected time point, the output of the switcher 6 from the PID adjustment section 2 side to the pattern generation section 5 side, so that an optimal signal is outputted from the pattern generation section 5 at an appropriate timing, thereby temporally cutting off the feed-back loop to carry out open-loop control for improved followability. Thereafter, at a time point at which the output of the adder 1 is expected to become substantially zero, or when the output of the adder 1 actually becomes substantially zero through supervision thereof, the output of the switcher 6 can be switched to the output of the PID adjustment section 2, thus enabling the same feedback control as conventionally done.

In this connection, it is to be noted that the control method performed by the control blocks as shown in FIG. 33 can be similarly applied to another control method carried out by control blocks illustrated in FIGS. 34 and 35. Here, the control blocks of FIG. 34 further include a second PID adjustment section 12 provided at a downstream side or stage of the switcher 6 in the control blocks of FIG. 33, and a second adder 4 disposed between the switcher 6 and the second PID adjustment section 12 for feeding back a second detected temperature value (auxiliary controlled variable) to form a feed-back loop 20 for cascade control. In this case, the heat treatment furnace 3 is constructed as illustrated in FIG. 29(b), but it is further provided with a second output end c for outputting the second detected temperature value (auxiliary controlled variable) in addition to a first output end b for outputting a first detected temperature value (main controlled variable). Here, note that the first and second detected temperature values are obtained by detecting the interior temperature of the reaction tube and the temperature in the vicinity of the heater, respectively, According to this method, when the response of the heat treatment furnace 3 has changed, such a change can be alleviated by the feed-back loop 20 to enhance the control response through effective utilization of the auxiliary controlled variable, thereby improving overall control performance of the system.

Moreover, a control block configuration shown in FIG. 35 has a second adder 14 and a second PID adjustment section 15 both disposed between the pattern generation section 5 and the switcher 6 in the control blocks of FIG. 33 to form a feed-back loop 21.

With this method, a controlled variable can be outputted to the heat treatment furnace 3 while adjusting the output of the pattern generation section 5 based on the feed-back control of the second detected temperature value (auxiliary controlled variable), so that a manipulated variable can be properly and adjustably controlled based on the actual control target, thereby alleviating a change thereof, In this regard, note that the output of the pattern generation section 5 is given by outputting a recorded value stored in a memory and the like.

In cases where control is effected using the pattern generation section of the configuration as illustrated in FIGS. 33 through 35, however, it is necessary for a specific skilled engineer to repeatedly effect the process treatments as illustrated in FIGS. 32(a) and 32(b) a number of times so as to adjust the output (i.e., stored values) of the pattern generation section 5, thus requiring a lot of labor and time. Besides, such adjustments are varied depending upon the skill of the engineer, differences among individuals, etc., so control quality after adjustments varies according to the adjusting person.

In particular, in cases where a plurality of control blocks as illustrated in FIGS. 33 through 35 are connected in parallel with each other as in the control blocks of FIG. 31 comprising a plurality of control blocks as shown in FIG. 28, there arises another problem that the outputs of the plurality of pattern generation sections 5 have to be adjusted, requiring a still longer time of adjustment and further increasing variations in the controlled variable. Moreover, if the output of each pattern generation section 5 is to be obtained from the previously stored values, a further problem will arise in that a tremendous capacity of memory is required.

SUMMARY OF THE INVENTION

In view of the above, the present invention is intended to obviate the above-mentioned various problems encountered with the prior art, and has for its object to provide a novel and improved semiconductor producing apparatus and a temperature control method therefor which are capable of making a detected temperature (controlled variable) follow a target value so as to be maintained at that value even if there takes place a rapid change in the target temperature.

Another object of the present invention is to provide a novel and improved semiconductor producing apparatus and a temperature control method therefor which do not require a great memory capacity.

Bearing the above objects in mind, according to a first aspect of the present invention, there is provided a semiconductor producing apparatus with a temperature control system, comprising: an adjuster for receiving a target value and a detected control value through an adder; a pattern generator having an approximate function for calculating a pattern output and capable of changing the pattern output in accordance with parameters of the approximate function; and a switch for switching between an output at least including the output of the pattern generator and an output of the adjuster to generate an output.

In a preferred form of the invention, the semiconductor producing apparatus further comprises an external disturbance adjuster for receiving the target value and the detected control value through another adder and generating an output which is to be added to the output of the pattern generator so as to adjust it against an external disturbance.

Such an arrangement is achieved, for example, by adding an output of an adjuster (external disturbance adjuster 202) to an output of a pattern generation section 8E, as shown in FIGS. 23 through 26.

According to a second aspect of the present invention, there is provided a semiconductor producing apparatus with a temperature control system, comprising: an adjuster provided with an I adjusting section for receiving a target value and a detected control value through an adder; a pattern generator having an approximate function for calculating a pattern output and capable of changing the pattern output in accordance with parameters of the approximate function; and a switch for switching between an output including the output of the pattern generator and an output of the adjuster including the I adjusting section to generate an output.

Here, the adjuster provided with an I adjusting section is indicated by reference numerals 201, 201A in FIGS. 23 through 26.

According to a third aspect of the present invention, there is provided a semiconductor producing apparatus with a temperature control system, comprising: a first adjuster for receiving a target temperature value of a heat treatment furnace and a first detected temperature value from the heat treatment furnace through an adder, a pattern generator having an approximate function for calculating a pattern output and capable of changing the pattern output in accordance with parameters of the approximate function; and a switch for switching between the output of the pattern generator and an output of the first adjuster to generate an output as a manipulated variable to the heat treatment furnace.

Such an arrangement is shown, for example, in FIG. 1 in which it includes a first adjuster (PID adjustment section 2) for receiving a first detected temperature value (output at b) from a heat treatment furnace 3, a pattern generator (pattern generation section 8), and a switch (switcher 6) for switching between outputs of the first adjuster (PID adjustment section 2) and the pattern generator (pattern generation section 8).

According to a fourth aspect of the present invention, there is provided a semiconductor producing apparatus with a temperature control system, comprising: a first adjuster for receiving, through a first adder, a target temperature value of a heat treatment furnace and a first detected temperature value from the heat treatment furnace; a pattern generator having an approximate function for calculating a pattern output and capable of changing the pattern output in accordance with parameters of the approximate function; a switch for switching between the output of the pattern generator and an output of the first adjuster to generate an output; and a second adjuster provided at an output side of the switch for receiving, through a second adder, the output of the switch and a second detected temperature value from the heat treatment furnace and generating an output as a manipulated variable to the heat treatment furnace.

Such an arrangement is shown in FIG. 9 in which a PID adjuster (second adjuster) 12 is illustrated as receiving an output of an adder (first adder) 6 via another adder (second adder) 4 and generating an output as a manipulated variable to a heat treatment furnace 3B.

According to a fifth aspect of the present invention, there is provided a semiconductor producing apparatus with a temperature control system, comprising: a first adjuster for receiving, through a first adder, a target temperature value of a heat treatment furnace and a first detected temperature value from the heat treatment furnace; a pattern generator having an approximate function for calculating a pattern output and capable of changing the pattern output in accordance with parameters of the approximate function; a second adjuster for receiving, through a second adder, the output of the pattern generator and a second detected temperature value from the heat treatment furnace; and a switch for switching between an output of the second adjuster and an output of the first adjuster to generate an output as a manipulated variable to the heat treatment furnace.

Such an arrangement is shown in FIG. 19 in which the first adjuster is illustrated as a PID adjustment section 2, and the second adjuster is illustrated as a PID adjustment section 12A.

According to a sixth aspect of the present invention, there is provided a semiconductor producing apparatus with a temperature control system, comprising: a third adjuster provided with an I element and a fourth adjuster unprovided with an I element each for receiving, through a first adder, a target temperature value of a heat treatment furnace and a first detected temperature value from the heat treatment furnace, a pattern generator having an approximate function for calculating a pattern output and capable of changing the pattern output in accordance with parameters of the approximate function; a switch for switching between an output at least including an output of the third adjuster and a sum of the output of the pattern generator and an output of the fourth adjuster; and a second adjuster for receiving, through a second adder, the output of the switch and a second detected temperature value from the heat treatment furnace and generating a manipulated variable to the heat treatment furnace.

Such an arrangement is shown in FIG. 23 or FIG. 24, in which the third adjuster provided with an I element is illustrated as an I adjustment section 201 or a PID adjustment section 201A, and me fourth adjuster unprovided with an I element is illustrated as a PD adjustment section 202. Also, the switch is illustrated as a switcher 203 and an adder 204 in FIG. 23, and as an adder 205 and a switcher 6 in FIG. 24.

According to a seventh aspect of the present invention, there is provided a semiconductor producing apparatus with a temperature control system, comprising: a third adjuster provided with an I element and a fourth adjuster unprovided with an I element each for receiving, through a first adder, a target temperature value of a heat treatment furnace and a first detected temperature value from the heat treatment furnace to generate an adjuster output; a pattern generator having an approximate function for calculating a pattern output and capable of changing the pattern output in accordance with parameters of the approximate function; a second adjuster for receiving, through a second adder, a sum of an output of the fourth adjuster and the output of the pattern generator, and a second detected temperature value from the heat treatment furnace; and a switch for switching between an output of the third adjuster and an output of the second adjuster to generate an output as a manipulated variable to the heat treatment furnace.

Such an arrangement is shown in FIG. 25 in which the third adjuster is illustrated as a PID adjustment section 201A, the fourth adjuster as a PID adjustment section 202, and the second adjuster as a PID adjustment section 12E, and a switcher 6 serves to switch over between outputs of the two PID adjustment sections 12E, 201A.

According to an eighth aspect of the present invention, there is provided a semiconductor producing apparatus with a temperature control system, comprising: a third adjuster provided with an I element and a fourth adjuster unprovided with an I element each for receiving, through a first adder, a target temperature value of a heat treatment furnace and a first detected temperature value from the heat treatment furnace; a pattern generator having an approximate function for calculating a pattern output and capable of changing the pattern output in accordance with parameters of the approximate function; a switch for switching among an output of the third adjuster, a sum of an output of the fourth adjuster and the output of the pattern generator, and the output of the pattern generator, and a second adjuster for receiving, through a second adder, the output of the switch and a second detected temperature value from the heat treatment furnace and generating an output as a manipulated variable to the heat treatment furnace.

Such an arrangement is shown in FIG. 26 in which a switch (switcher 6E) serves to switch over between an output of the fourth adjuster (PD adjustment section 202), an output of a pattern generator (pattern generation section 8E), and a summed output formed of an output of the third adjuster (PID adjustment section 201A) and an output of the pattern generator (pattern generation section 8E) whereas the second adjuster (PID adjustment section 12E) outputs a manipulated variable to a heat treatment furnace 3 bas on an output of the switch (switcher 6E) and a second detected temperature value (output at c) inputted thereto via a second adder 4E.

In another preferred form of the invention, the fourth adjuster unprovided with an I element comprises a PD adjuster, and the third adjuster provided with an I element comprises an adjuster including a PID factor or a PI factor or an adjuster including an I element alone.

In a further preferred form of the invention, the first detected temperature value is an average value obtained by averaging temperature values detected at a plurality of locations of an object to be controlled with a predetermined ratio.

Such an arrangement is shown in FIG. 8 in which an averaging section 17 serves to average temperature values detected at a plurality of locations of an object (heat treatment furnace 3B) to be controlled with a predetermined ratio.

In a yet further preferred form of the invention, the semiconductor producing apparatus further comprises a parameter compensator for generating a compensation value which is used for compensating the parameters of the approximate function of the pattern generator based on the first detected temperature value.

In a still further preferred form of the invention, the parameter compensator sets an evaluation value E having a correlation with the parameters of the approximate function and evaluating whether the temperature control is good or bad, previously determines an interference matrix M ($M \times \Delta P = \Delta E$) representative of a relation between a minimal change $\Delta P$ of a parameter P and a minimal change $\Delta E$ of the evaluation value E which is caused by the minimal change ΔP given to the parameter P, and calculates, as a parameter compensation value, such an amount of change of the parameter P as to make the evaluation value E to be a desired value by using the interference matrix M.

In a further preferred form of the invention, the semiconductor producing apparatus further comprises a parameter compensator for generating a compensation value which is used for compensating the parameters of the approximate function of the pattern generator based on the first detected temperature value, wherein the parameter compensator has an interference matrix M for calculating, as a parameter compensation value, such an amount of change in a parameter as to make the evaluation value lo be a desired value, the interference matrix having, as its factors, transfer gains each representative of a relation between a manipulated variable to the heat treatment furnace and the detected temperature value from the heat treatment furnace, whereby the parameter is compensated by the parameter compensation value thus obtained, so that the pattern generator generates a functional output by use of the compensated parameter, the switch being operable to select the output of the adjuster when a change of the target value over time is relatively limited, and the output of the pattern generator when a change in the target value over time is relatively great, so as to use it for control operation.

In a further preferred form of the invention, the semiconductor producing apparatus further comprises a parameter compensator for generating a compensation value which is used for compensating the parameters of the approximate function of the pattern generator based on the first detected temperature value; wherein the parameter compensator has an interference matrix M for calculating, as a parameter compensation value, such an amount of change in a parameter as to make an evaluation value E, which has a correlation with the parameter, to be a desired value; the interference matrix M is calculated by the following formula;

$$M = (Eu + G \times Kp)^{-1} \times G$$

where G is a matrix having, as its factors, transfer gains each representative of a relation between a manipulated variable to the heat treatment furnace and the detected temperature value from the heat treatment furnace; and Kp is a diagonal matrix having, as its diagonal factors. constants of a P factor of the fourth adjuster inclusive of no integral factor; and Eu is an unit matrix; the parameter is compensated by the parameter compensation value thus obtained, so that the pattern generator generates a functional output by use of the compensated parameter; and the switch is operated to select the output of the adjuster when a change of the target value over time is relatively limited, and the output of the pattern generator when a change in the target value over time is relatively great, so as to use it for control operation.

In a further preferred form of the invention, upon switching of the adjuster, the output of the switch immediately after the switching is adjusted based on the output of the switch immediately before the switching, for example as shown in FIGS. 17 and 18.

In a further preferred form of the invention, when the output of the switch is switched over from the output of the first adjuster into the output of the pattern generator, the output of the pattern generator is adjusted in accordance with the output of the first adjuster immediately before the switching, for example as shown in FIG. 18.

In a further preferred form of the invention, when the output of the adjuster is switched over from the output of the first adjuster into the output of the second adjuster, the output of the pattern generator is adjusted in accordance with the output of the second detected temperature value immediately before the switching, for example as shown in FIG. 22.

In a further preferred form of the invention, the object to be controlled is a temperature in the heat treatment furnace; in a temperature control process in which the temperature in the heat treatment furnace is raised to a process temperature, the approximate function f of the pattern generator is expressed as follows;

$$f(t-t_0, TI_i, YI_i, YG_i, YF_i)$$

$$= \begin{cases} \text{Max}, & t_0 \leq t < t_0 + TI_i \\ YI_i + YG_i \cdot (t - t_0), & t_0 + TI_i \leq t < t_2 \\ \text{Min}, & t_2 \leq t \end{cases}$$

where t is a time variable; $t_0$ is a start time at which the target temperature begins to rise; $t_2$ is a time at which the function $(YI_i + YG_i \cdot (t-t_0))$ reaches $YF_1$; and $TI_i$, $YI_i$, $YG_i$ and $YF_i$ are parameters.

In a further preferred form of the invention, the object to be controlled is a temperature in the heat treatment furnace; in a temperature control process in which the temperature in the heat treatment furnace is raised to a process temperature, the approximate function $f$ of the pattern generator is expressed as follows;

$$f(t-t_0, YI_i, YG_i, YF_i)$$

$$= \begin{cases} YI_i + YG_i \cdot (t - t_0), & t_0 \leq t < t_2 \\ YF_i, & t_2 \leq t \end{cases}$$

where t is a time variable; $t_0$ is a start time at which the target temperature begins to rise; $t_2$ is a time at which the function $(YI_i + YG_i \cdot (t-t_0))$ reaches $YF_i$; and $YI_i$, $YG_i$ and $YF_i$ are parameters.

In a further preferred form of the invention, the object to be controlled is a temperature in the heat treatment furnace; in a temperature control process at the time when a boat is loaded into the heat treatment furnace, the approximate function $f$ of the pattern generator is expressed as follows;

$$f(t-t_0, YI_i, YG_i) = YI_i + YG_i \cdot (t-t_0), \quad t_0 \leq t$$

where t is a time variable; $t_0$ is a start time at which the boat begins to be loaded into the furnace; and $YI_i$ and $YG_i$ are parameters.

In a further preferred form of the invention, the object to be controlled is a temperature in the heat treatment furnace; in a temperature control process at the time when a boat is loaded into the heat treatment furnace, the approximate function $f$ of the pattern generator is expressed as follows;

$$f(t-t_0, \Delta YI_i, YG_i) = \Delta YI_i + YG_i \cdot (t-t_0) + Y_0, \quad t_0 \leq t, \ i=1,2 \ldots, M$$

where t is a time variable; $t_0$ is a start time at which the boat begins to be loaded into the furnace; $\Delta YI_i$ is a difference between $YI_i$ and $Y_0$ upon switching; and $Y_0$ is an output value of the first adjuster upon switching.

In a further preferred form of the invention, the object to be controlled is a temperature in the heat treatment furnace; in a temperature control process in which the temperature in the heat treatment furnace is raised to a process temperature, the approximate function of the pattern generator is expressed as follows;

$$f(t-t_0, \Delta YI_i, YG_i, \Delta YF_i)$$

$$= \begin{array}{ll} \Delta YI_i + YG_i \cdot (t - t_0) + Y_0, & t_0 \le t < t_2 \\ \Delta YF_i + Y_0, & t_2 \le t \end{array}$$

where t is a time variable; $t_0$ is a start time at which the target temperature begins to rise; $t_2$ is a time at which the function $(YI_i + YG_i \cdot (t-t_0))$ reaches $YF_1$; $\Delta YI_i$ is a difference between $YI_i$ and $Y_0$); $\Delta YF_i$ is a difference between $YF_i$ and $Y_0$; and $Y_0$ is an output value of the first adjuster upon switching.

With the semiconductor producing apparatus as described above, even if there takes place an abrupt change in the target temperature value, it is possible to make the detected temperature value (controlled variable) quickly follow the target temperature value so as to be maintained at that temperature. As a result, the time-related production efficiency can be improved, and a semiconductor producing apparatus can be provided which does not require any tremendous memory capacity.

According to a ninth aspect of the present invention, there is provided a temperature control method for a semiconductor producing apparatus wherein upon determining the interference matrix, a heat treatment is carried out to obtain a first evaluation value for a prescribed evaluation item with a specified parameter being temporally set to a first value, then another heat treatment is carried out to obtain a second evaluation value for the prescribed evaluation item with the specified parameter being temporally set to a second value, and an interference matrix is previously calculated based on the temporally set first and second values and the first and second evaluation values; upon compensating the specified parameter, a third evaluation value is determined by effecting a further heat treatment after the determination of the interference matrix, so that a compensated value of the specified parameter is calculated based on a difference between the thus determined third evaluation value and a desired evaluation value using the interference matrix to thereby compensate the specified parameter, and generates, as the output of the pattern generator, a functional output using the compensated specified parameter; and upon performing temperature control, in the case where a change in the target value over time is relatively limited, the output of the adjuster is selected for use with control operation, whereas in the case where a change over time of the target value is relatively large, the output of the pattern generator is selected for use with control operation.

In a further preferred form of the invention, the compensated specified parameter is further compensated based on a difference between an actually measured evaluation value obtained upon the heat treatment using the compensated parameter and a desired evaluation value.

In a further preferred form of the invention, the pattern generation output of the function is previously calculated and stored, and the stored value is used as the output value of the pattern generator.

In a further preferred form of the invention, the output of the adjuster is selected when a change in the target value over time is relatively limited, whereas the output of the pattern generator is selected when a change in the target value over time is relatively great.

In a further preferred form of the invention, the output of at least the I adjusting section of the adjuster is selected when a change in the target value over time is relatively limited, whereas the output of the pattern generator is selected when a change in the target value over time is relatively great.

In a further preferred form of the invention, the first adjuster is provided at least with an I adjusting section; the switch is constructed so as to switch between an output including the output of the pattern generator and at least the output of the I adjusting section of the adjuster; and the output of at least the I adjusting section of the adjuster is selected when a change in the target value over time is relatively limited, whereas the output of the pattern generator is selected when a change in the target value over time is relatively great.

In a further preferred form of the invention, a parameter compensator is provided for generating a compensation value for compensating the parameters of an approximate function of the pattern generator based on the detected control value.

According to a tenth aspect of the invention, there is provided a temperature control method for a semiconductor producing apparatus including: a third adjuster provided with an I element and a fourth adjuster unprovided with an I element each for receiving, through a first adder, a target temperature value of a heat treatment furnace and a first detected temperature value from the heat treatment furnace; a pattern generator having an approximate function for calculating a pattern output and capable of changing the pattern output in accordance with parameters of the approximate function; and a switch for switching between a first output of the third adjuster, a second output in the form of a sum of an output of the fourth adjuster and the output of the pattern generator, and a third output of the pattern generator; wherein the switch is operated in such a manner that it selects the first output to carry out temperature control when a change in the target value over time is relatively limited, the second output to carry out temperature control when a change in the target value over time is relatively great, and the third output to carry out temperature control in a transient period in which a change in the target value over time transfers or shifts from a relatively great state to a relatively limited state.

In a further preferred form of the invention, the state of a change in the target value over time being relatively great is a ramp-up period, and the transient period of a change in the target value over time transferring from a relatively great state into a relatively limited state is an end point of the ramp-up period.

With the temperature control method as described above, even in the event an abrupt change takes place in the target temperature value, it is possible to make the detected temperature value (controlled variable) quickly follow the target temperature value so as to be maintained at that temperature Consequently, the time-related production efficiency can be improved, and a temperature control method can be provided which does not require any tremendous memory capacity.

According to an eleventh aspect of the invention, there is provided a method for producing a semiconductor device by using the temperature control method for a semiconductor producing apparatus as described above.

The above and other objects, features and advantages of the present invention will readily become apparent to those skilled in the art from the following detailed description of preferred embodiments of the invention when taken in conjunction with the accompanying drawings.

BRIEF DESCRIPTION OF THE DRAWINGS

FIGS. 4(a) and 4(b) are illustrations showing a parameter update procedure;

FIGS. 27(a) to 27(c) are illustrations showing the operation of the seventh embodiment;

DESCRIPTION OF THE PREFERRED EMBODIMENTS

Now, preferred embodiments of the present invention will be described below while referring to the accompanying drawings.

Embodiment 1

First, the configuration of a first embodiment of the invention will be described below by referring to FIG. 1. In a block diagram of FIG. 1, an explanation will be made with the same portions as those in FIG. 33 being designated by the same symbols.

Figure 1:
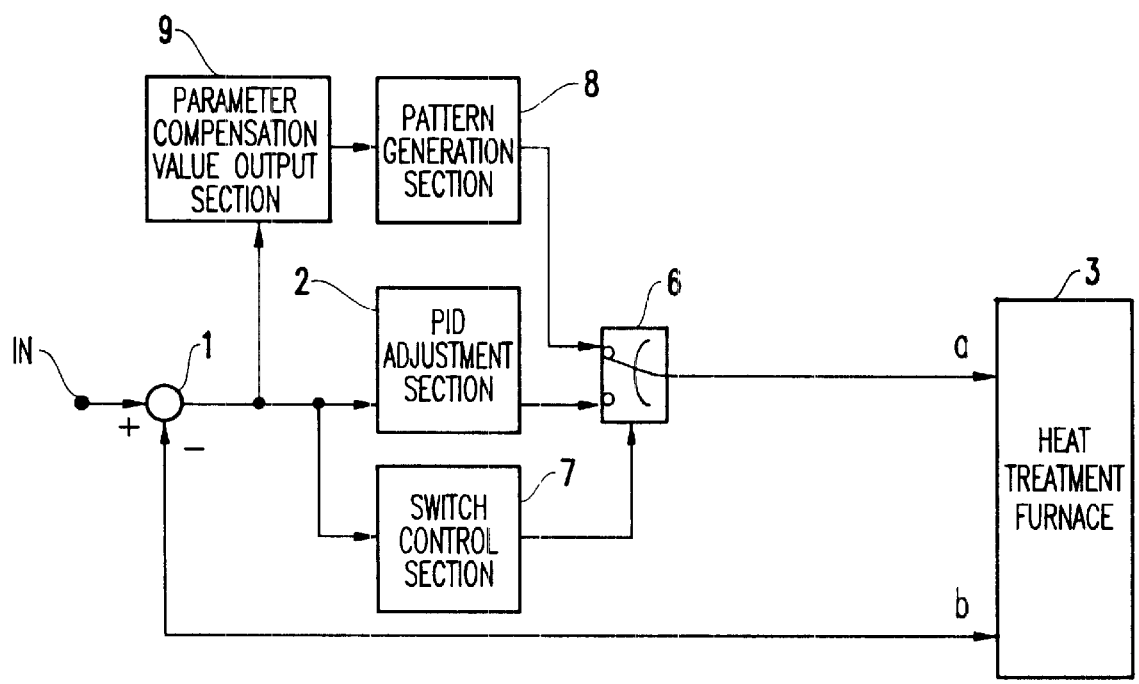
FIG. 1 is a control block diagram showing a first embodiment of the present invention using one zone.
Figure 33:
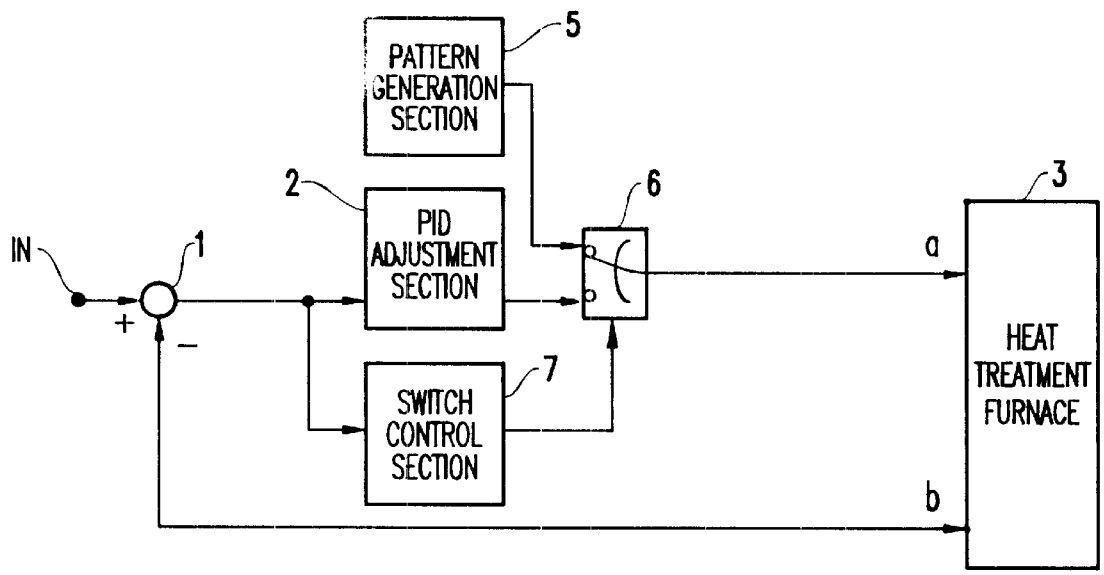
FIG. 33 is a first temperature control block diagram including a pattern generation section.
Figure 34:
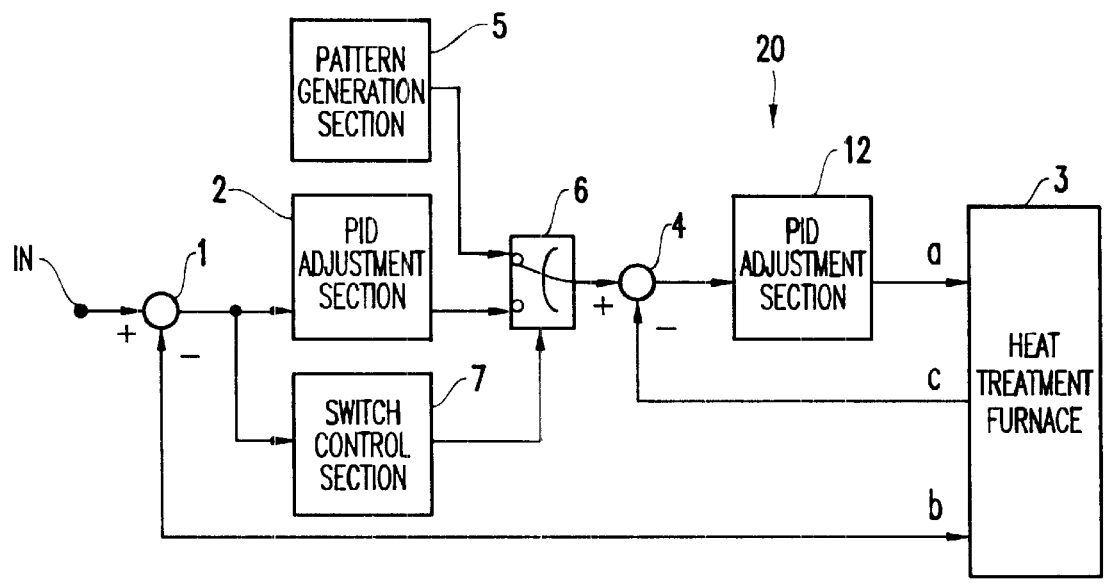
FIG. 34 is a second temperature control block diagram including a pattern generation section.

The configuration shown in FIG. 1 includes, as the same components as those of the conventional configuration shown in FIG. 33, an adder 1 to which a target temperature value of a heat treatment furnace 3 inputted from an input terminal IN and a first detected temperature value serving as a controlled variable supplied from the heat treatment furnace 3 are Inputted, a PID adjuster in the form of a PID adjustment section 2 provided at an output side of the adder 1 to perform PID control in accordance with the output of the adder 1, a switch in the form of a switcher 6 provided at an output side of the PID adjustment section 2 to switch between an output of the PID adjustment section 2 and an output of a pattern generation section to be described later to generate an output to the heat treatment furnace 3 as an operation quantity, and a switch control section 7 provided at the output side of the adder 1 to output a control signal for changing the switcher 6, and in addition to these components, it further includes, as characteristic components of the present invention, a parameter compensator in the form of a parameter compensation value output section 9 provided at the output side of the adder 1, and a pattern generator in the form of a pattern generation section 8 provided at an output side of the parameter compensation value output section 9.

The switch control section 7 has a clock for starting time measurement simultaneously with a temperature control operation in accordance with an output of the adder 1, and changes the output of the switcher 6 from a PID adjustment section 2 side to a pattern generation section 8 side at a scheduled or expected time when a sudden change in the target temperature value occurs. The time when a sudden change in the target temperature value occurs (that is, the time that has elapsed after the control operation started) is previously set to a unillustrated memory in the switch control section 7.

The pattern generation section 8 has a clock showing the same or common time as the time of the clock of the switch control section 7, computes a pattern output in accordance with a function previously set in the pattern generation section 8 while using time points (time) and a plurality of parameters as factors, and generates the pattern output at the set time when a sudden change in the target temperature value occurs. The output is inputted to one input end of the switcher 6.

Figure 28:
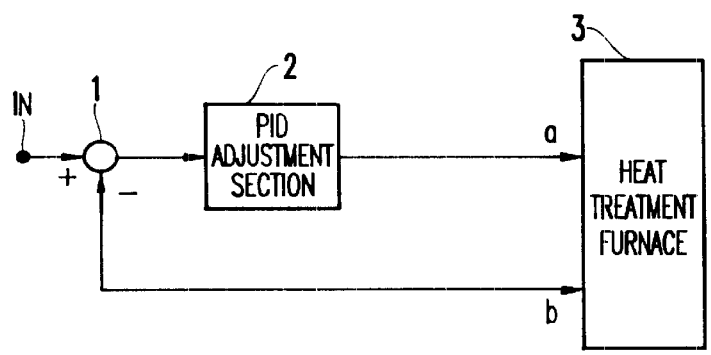
FIG. 28 is a block diagram showing conventional feedback control.

A function to be previously set is experimentally obtained. For example, when the target temperature value is changed in a manner as shown at S103 in FIG. 32(a), the function is obtained by using a specific function covering an output pattern allowing a first detected temperature value (controlled quantity or variable) to quickly follow. The function can be also obtained by using a specific function covering the pattern of a manipulated quantity or variable for an input end a obtained as the result of experimentally performing the control through the control block configuration shown in FIG. 28 with, for example, a dummy wafer.

The parameter compensation value output section 9 evaluates the output value of the adder 1 in accordance with a predetermined evaluation method to calculate a compensation value (compensation quantity) for compensating a parameter. In this calculation, by assuming that values of predetermined evaluation items to be mentioned later (e.g., a deviation between the target value and the controlled variable, an inclination of the deviation, and an overshoot value) constitute a linear equation (linear algebra) using parameters as variables, a relation between change values (compensation values) of evaluation values and parameters are shown by a matrix (interference matrix) and parameter compensation values are determined by using the interference matrix so that a desired evaluation value can be obtained. The interference matrix is obtained before compensation of parameters as described later. Because the first embodiment handles one zone, the interference matrix is shown by one row and one column (1×1 matrix).

A parameter compensation value calculated by the parameter compensation value output section 9 is inputted to the pattern generation section 8. The pattern generation section 8 compensates the parameter of the function of its own (for example, adds a compensation value to a parameter under compensation) by using the compensation value and outputs a function value according to the compensated parameter as a pattern.

Operations of the control blocks shown in FIGS. 1 and 2 will be described below.

Figure 2:
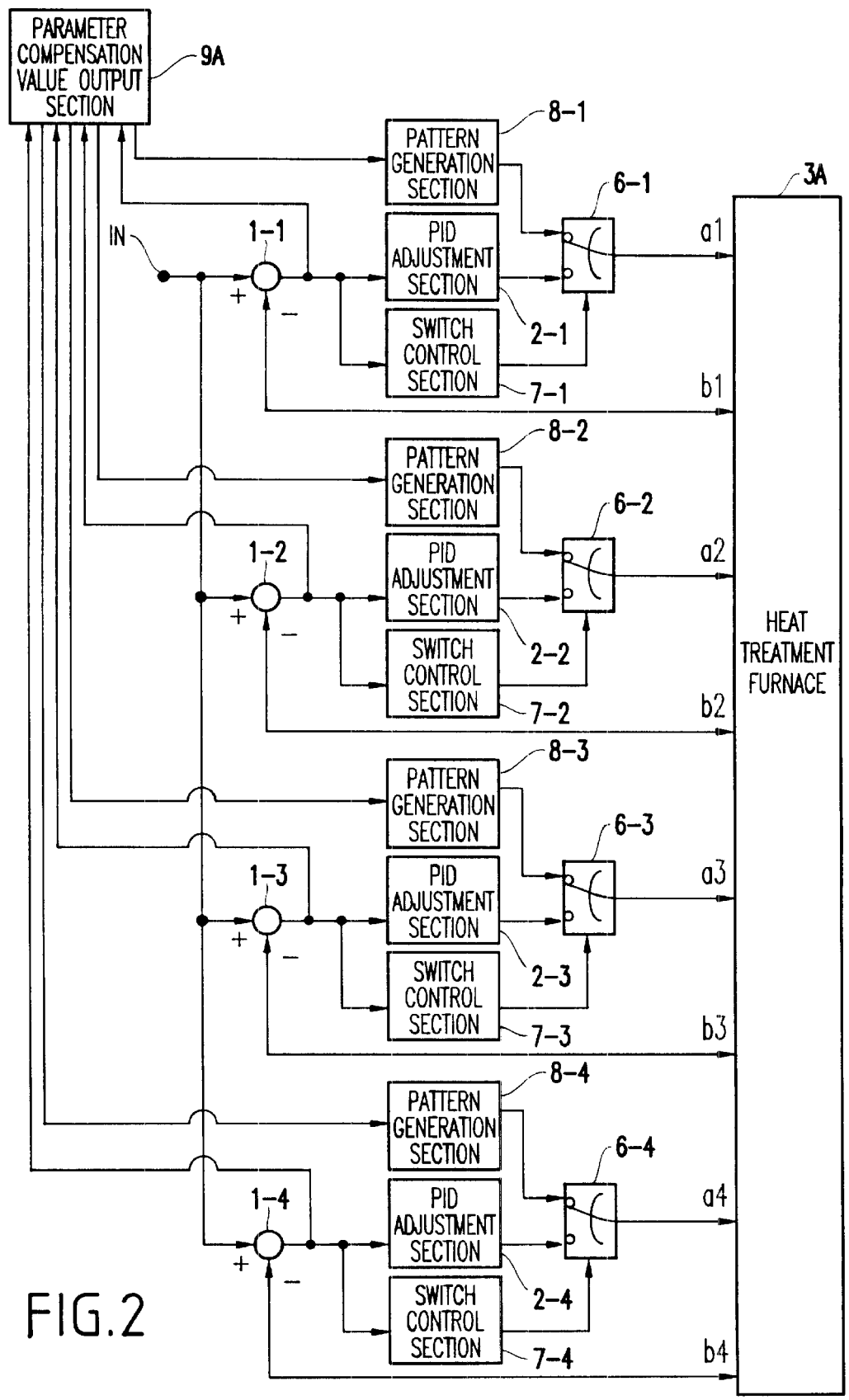
FIG. 2 is a control block diagram showing the first embodiment of the present invention using four zones.
Figure 30:
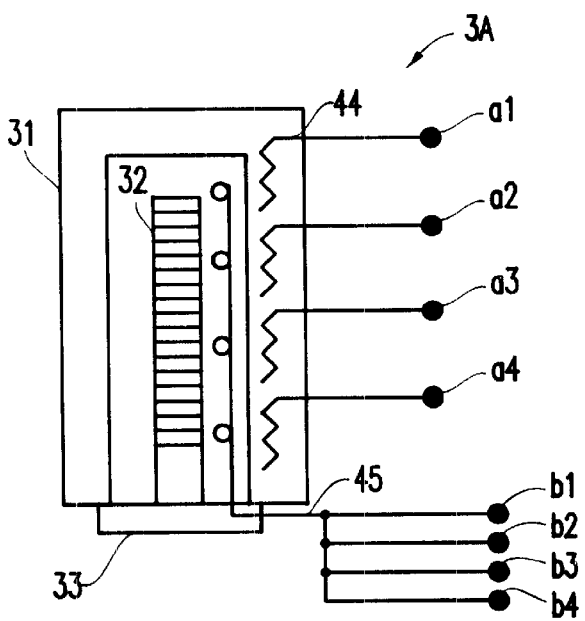
FIG. 30 is a schematic view showing a heat treatment furnace when four zones are used.
Figure 31:
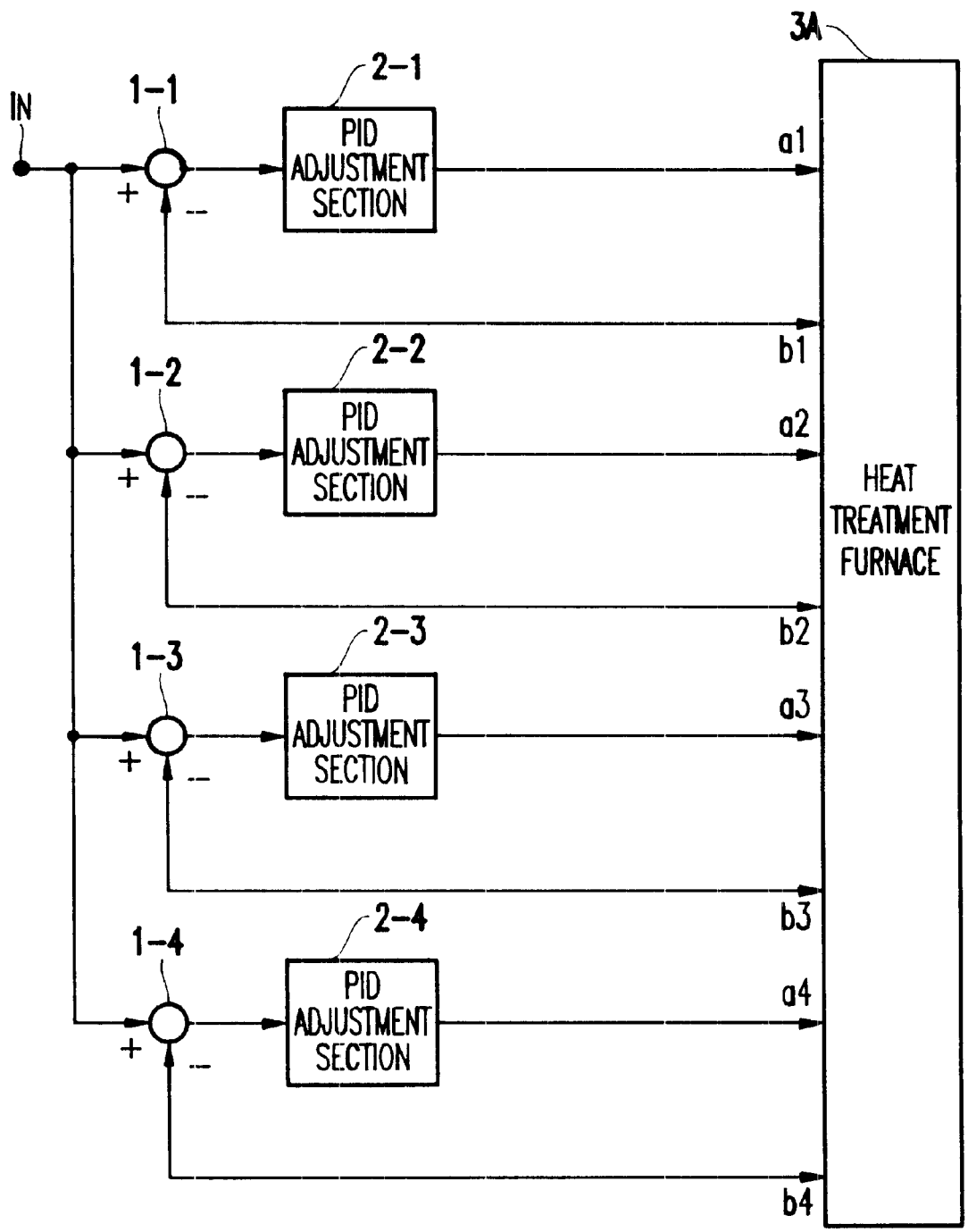
FIG. 31 is a block diagram showing conventional feedback control when four zones are used.

FIG. 2 is a block diagram showing the configuration to which the control blocks shown in FIG. 1 are applied when a heat treatment furnace 3A has a plurality of zones, for example, four zones shown in FIG. 30. The following description will be made with the same components in FIGS. 1 and 31 designated by the same symbols.

The diagram shown in FIG. 2 is configured by adders 1-1 to 1-4, PID adjustment sections 2-1 to 2-4, a heat treatment furnace 3A, switchers 6-1 to 6-4, and switch control sections 7-1 to 7-4, pattern generation sections 8-1 to 8-4, and a parameter compensation value output section 9A. Components used other than the heat treatment furnace 3A and the parameter compensation value output section 9A are equal in number to the zones of the heat treatment furnace 3A and a number conforming to a corresponding zone number is attached after a hyphen to each of the components. In this case, all function forms of the plural pattern generation sections 8-1 to 8-4 are the same so that parameter correction can be made by an interference matrix to be mentioned later. This is because, unless the function forms are the same, the number of parameters differs in respective functions or compositions of parameters differ even if the number of parameters is the same and thus, compositions of influences on evaluation values differ.

The parameter compensation value output section 9A evaluates values outputted from all adders 1-i (i denotes a zone number and shows any one of 1 to 4 in case of FIG. 2) in accordance with a predetermined evaluation method similar to the case of FIG. 1, calculates a plurality of parameter compensation values used by all pattern generation sections 8-i by means of an interference matrix formed in advance, and outputs the calculated compensation values to the pattern generation sections 8-i.

Then, the operation of the first embodiment will be described below by assuming that a heat treatment furnace has M zones. Operations of control blocks in FIGS. 1 and 2 will be described by assuming M=1 and M=4, respectively, and the following description will be made in accordance with FIG. 2.

In case of this embodiment, it is assumed that evaluation values (outputs of adders for evaluation items including (1) a deviation between a target temperature value and a detected temperature value (controlled variable), (2) an inclination of the detected controlled temperature value (controlled variable), and (3) a value corresponding to an overshoot value) and parameter values of functions by the pattern generation section 8 are shown by a primary linear algebra to obtain a relational equation (interference matrix M to be mentioned later) between the evaluation values and the parameters, and the compensation values of the parameters are calculated by using the interference matrix in order to make the present evaluation value become a desired evaluation value.

In case of the control by the configuration shown in FIG. 2, feedback control and open-loop control are switched as in the description for FIG. 33. When a parameter is compensated (updated), the output of the adder 1-i under the process treatment described by referring to FIGS. 32($a$) and 32($b$) is inputted to the parameter compensation value output section 9A. The parameter compensation value output section 9A evaluates the output of the adder 1-i by using the input data and generates a parameter compensation value by using a changed value of the evaluation value (value for changing the evaluation value to a desired value) and the interference matrix.

The parameter compensation value is calculated in accordance with the output of the adder 1-i so that a plurality of parameters working on the output of a pattern generation section 8-i become optimum values in accordance with a change in the target value inputted from the input terminal IN at that time. The calculation of the compensation value is applied to all of M pattern generation sections 8-i.

The calculated parameter compensation value is inputted to the pattern generation sections 8-i (i=1, 2, ... ). Each pattern generation section 8-i updates or compensates a plurality of parameters by using the input parameter compensation value and outputs computation results of functions (having a common function form) previously set by using the compensated parameters. Moreover, the output of each pattern generation section 8-i is directly inputted to the heat treatment furnace 3A independently of a detected temperature value (controlled variable) outputted from the heat treatment furnace 3A, when the switcher 6i selects the output side of the pattern generation section 8-i. Therefore, a manipulated variable for the heat treatment furnace 3A is determined independently of the output of each PID adjustment section 2-i.

The output of the pattern generation section 8-i is generally shown by the following Equation (1) when assuming a common function to be previously set to the first to the Mth pattern generation sections 8-i as $f$.

(Output of pattern generation section 8-i)=$7l$ $(t-t_{(i)}, p1_i, p2_i, \Lambda, pN_i)$ $i$=1, 2, $\Lambda$, $M$              (1)

In the above Equation, I denotes the present point in time (time), $t_0$ denotes a point in time at which a sudden change in the target value previously set to the switch control section 7-i or pattern generation section 8-i occurs. Moreover, $p1_i, p2_i, \ldots, pN_i$ denote N parameters related to the output of the pattern generation section 8-i.

Figure 3A:
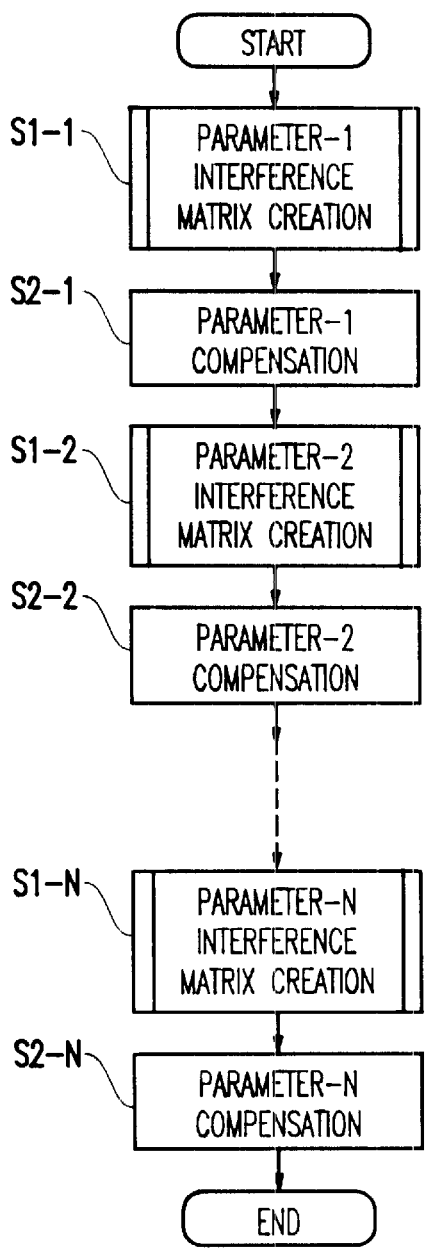
FIGS. 3(a) and 3(b) are illustrations showing an interference-matrix creation procedure.
Figure 3B:
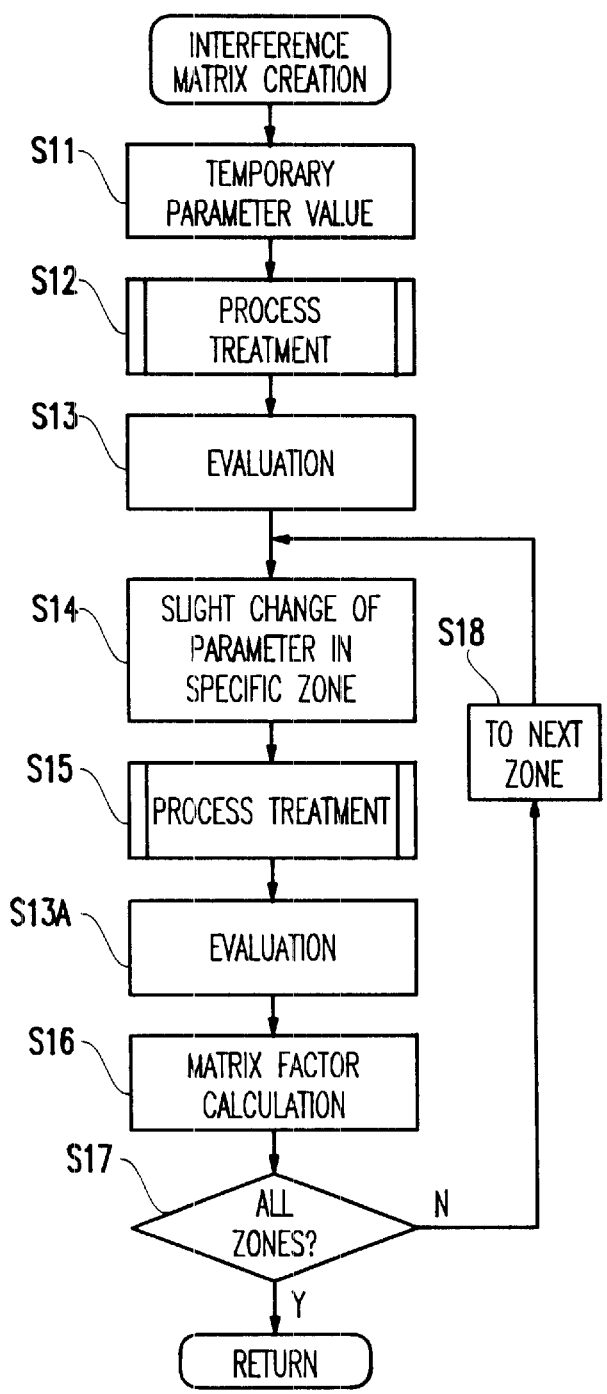

An interference matrix used for the parameter compensation value output section 9A is derived by previously performing the procedures, for example, shown in FIGS. 3(a) and 3(b).

Then, a procedure for interference matrix derivation to be previously performed will be described below by referring to FIGS. 3(a) and 3(b). A series of procedures are performed before an actual process treatment, which is normally performed by using a dummy wafer.

FIG. 3(a) shows a general flow chart. In this figure, step S1-j denotes interference matrix generation related to one parameter pj (j denotes a parameter number which is equal to "1" in step Si-1) and details are shown in FIG. 3(b). The parameter pj denotes a column vector having M factors shown by the following Equation (2) obtained by collecting the jth parameters from zone 1 up to zone M together.

$$pj=[pj_1 \, pj_2 \, \Lambda \, pj_M]^T j=1, 2, \Lambda, N \quad (2)$$

In the above Equation, symbol $[\ ]^T$ designates a transposed matrix.

In FIG. 3(b), step S11 is a processing for setting a temporary value of the parameter pj in the pattern generation section 8-i. The initial value of the temporary value may be an average value of past records or a value approximating a pattern outputted from the PID adjustment section 2-i as the result of performing the control by the configuration shown in FIG. 31. Moreover, when a parameter has already been updated, a value updated by that point in time is set.

Figure 32B:
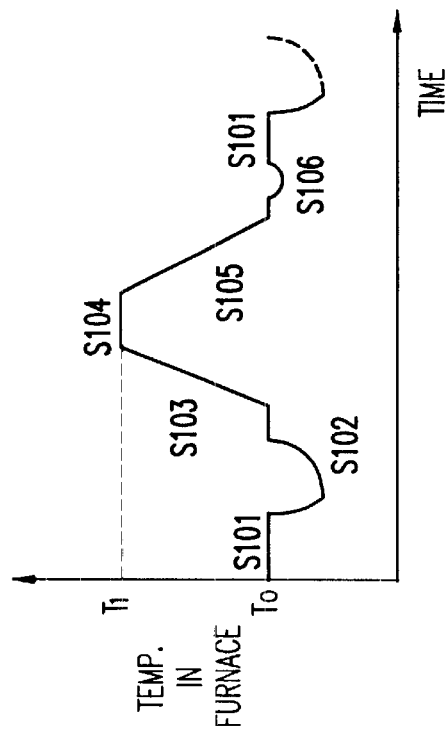
FIGS. 32(a) and 32(b) are illustrations showing a heat treatment (temperature control) procedure in a semiconductor producing apparatus.
Figure 32A:
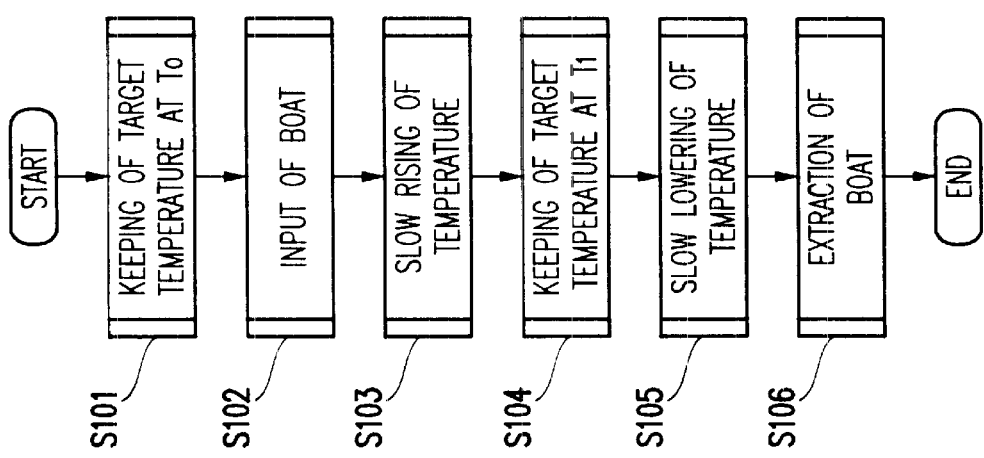

Step S12 is a processing for performing the process treatment described for FIGS. 32(a) and 32(b). Step S13 is a processing for evaluating the control performance in step S12. That is, evaluation is performed in accordance with specific evaluation items from the whole or a part of the data outputted from the adder 1 in step S12. In this case, it is preferable to use items capable of evaluating the quality of temperature control and having a great correlation to the change of parameters pj (that is, items in which evaluation values of the parameters greatly change by reflecting the change of the parameters). An evaluation value obtained as the result of evaluation is shown by a column vector ej having M factors shown by the following Equation (3).

$$ej=[ej_1 ej_2 \Lambda \, ej_M]^T j=1, 2, \Lambda, N \quad (3)$$

Step S14 is a processing for setting a parameter $pj_i$ related to a zone i among the parameters pj by changing the parameter $pj_i$ by a very small value $\Delta pj_i$. Though step S15 is the same as step S12, it is provided with a different number for later description. Step S13A performs the same processing as in step S13. Step 816 performs the processing for calculating the jth column vector $mj_i$ of the interference matrix Mj related to the parameter pj by the following Equation (4).

$$mj_i=(ej-ej')/\Delta\Delta pj_i \, i=1, 2, \Lambda, M, j=1, 2, \Lambda, N \quad (4)$$

In the above Equation, ej denotes the evaluation value vector in the last step (step S13A) and ej' denotes the evaluation value vector in the second last step (step S13). Specifically, when the processing in step S13 is executed for pj after step S12 and then, the processing in S13A is executed after steps S14 and S15, the evaluation result for step S12 is ej' and the evaluation result for step S15 is ej. Then, in step S16, $mj_i$ is calculated by using ej and ej'. The interference matrix Mj is an M×M matrix shown by the following Equation (5) using $mj_i$.

$$Mj=[mj_1 mj_2 \Lambda \, mj_M]j=1, 2, \Lambda, N \quad (5)$$

Steps S17 and S18 are processings for instructing execution of S14, S15, S13A, and S16 on all M zones. When execution of these steps is already completed on all M zones, the process is returned to step S1 in FIG. 3(a) which is finished. In FIG. 3(a), step S2-1 is a processing for calculating a parameter compensation value by the parameter compensation value output section 9A in accordance with the following Equation (6) by using the obtained interference matrix.

$$\Delta pj=\mu \times Mj^{-1} \times \Delta ej \quad (6)$$

In the above Equation, $\Delta pj$ denotes a compensation value of the jth parameter pj, $\mu$ denotes a step size parameter having a value of, for example, 0.7 to 1.0 (1 for this embodiment), and $Mj^{-1}$ denotes an inverse matrix of the interference matrix (M×M matrix). Symbol $\Delta ej$ denotes a value to be corrected with respect to the evaluation value vector ej. For example, when it is requested that the evaluation value vector ej finally becomes zero vector, $[00 \ldots 0]^T - ej = -ej$ is set to $\Delta ej$. The compensation value $\Delta pj$ thus obtained is inputted to the pattern generation section 8-i as described later and added to the parameter pj up to that time so as to compensate for the parameter.

In this case, $\mu$ is used to reduce the influence of an over-correction or erroneous correction of a parameter. An erroneous correction is mainly caused by a fluctuation or variation of the evaluation value due to noise, external disturbances, or a change in the circumferential environment. Moreover, even if there is no step size parameter (when $\mu=1$), a corrected value is compensated by a parameter compensation value. Therefore, the corrected value finally converges to an optimum value. However, if the corrected value in compensation decreases, the influence of the fluctuation increases and thereby, the corrected value vibrates nearby the optimum value and it may not easily converge. Therefore, in this case, by decreasing the value of it and correcting a parameter little by little, it is possible to more quickly converge the corrected value. The value of it is experientially determined. For example, when the change in the evaluation value is vibrational in the process of parameter correction, the value of $\mu$ is set to a small value. When the change in parameters is small or limited and an expected evaluation value cannot be quickly obtained, the value of $\mu$ is set to a large value.

To understand the above description, a parameter YI is specifically explained below through an Equation by using the case of two zones as an example for simplification. It is assumed that the parameter YI serves as a parameter $YI_i$ and a parameter $YI_2$ for two zones.

When evaluation values $EY_i$ for these parameters are assumed to be $-\alpha 1$ and $-\alpha 2$ ($EY_1=[-\alpha 1 -\alpha 2]^T$), the parameters are correlated to the evaluation values by using the following simultaneous linear equations.

$$YI_1 \times (\text{grad1}) + YI_2 \times (\text{grad2}) + C1 = -\alpha 1$$

$$YI_1 \times (\text{grad3}) + YI_2 \times (\text{grad4}) + C2 = -\alpha 2$$

In the above equations, (grad1) to (grad4) denote inclinations (constants) obtained by applying linear approximation to an originally non-linear temperature characteristic by limiting the characteristic to a certain temperature zone, and C1 and C2 denote unknown constants.

When it is assumed that $EY_1=[-\alpha 1+\beta 1 \, -\alpha 2+\beta 2]^T$ is obtained for $YI=[YI_1+d1 \, YI_2]^T$, the following Equation is effectuated.

$$(YI_1+d1)\times(\text{grad}1)+YI_2\times(\text{grad}2)+C1=-\alpha 1+\beta 1$$

$$(YI_1+d1)\times(\text{grad}3)+YI_2\times(\text{grad}4)+C2=-\alpha 2+\beta 1$$

Therefore, grad$1=\beta 1/d1$ and grad$3=\beta 2/d1$ are obtained.

Then, when it is assumed that $EY_1=[-\alpha 1+\gamma 1\ -\alpha 2+\gamma 2]^T$ is obtained for $YI=[YI_1\ YI_2=d2]^T$, the following Equation is effectuated.

$$YI_1\times(\text{grad}1)+(Y_2+d2)\times(\text{grad}2)+C1=-\alpha 1+\gamma 1$$

$$YI_1\times(\text{grad}3)+(Y_2+d2)\times(\text{grad}4)+C2=-\alpha 2+\gamma 2$$

Therefore, grad$2=\gamma 1/d2$ and grad$4=\gamma 2/d2$ are obtained.

Therefore, when it is assumed that $YI=[YI_1+x1\ YI_2+x2]^T$ is set and thereby, $EY_1=[0\ 0]^T$ is effectuated, the following simultaneous equations are effectuated.

$$(YI_1+x1)\times(\text{grad}1)+(YI_2+x2)\times(\text{grad}2)+C1=0$$

$$(YI_1+x1)\times(\text{grad}3)+(YI_2+x2)\times(\text{grad}4)+C2=0$$

Therefore, by combining these simultaneous equations, the following Equation can be obtained and it is possible to calculate x1 and x2.

$$x1\times(\beta 1/d1)+x2\times(\gamma 1/d2)=\alpha 1$$

$$x1\times(\beta 2/d1)+x2\times(\gamma 2/d2)=\alpha 1$$

The above equations are shown as the following Equation using an interference matrix MYI.

$$MYI\times[x1x2]^T=[\alpha 1\alpha 2]^T$$

Thus, it is understood that x1 and x2 correspond to $\Delta pj$ shown in the Equation (6) and $\alpha 1$ and $\alpha 2$ correspond to $\Delta ej$ shown in the Equation (6).

In FIG. 3(a), first to Nth parameters are compensated in steps S2-1 to S2-N and a corresponding parameter number j is shown after a hyphen.

Parameter compensation (steps S2-1 to S2-N) is performed to further improve the accuracy of creation of an interference matrix to be performed in the next steps (steps S1-2 to S1-N) (it is possible to improve the accuracy by evaluating step S13 and step S13A in FIG. 3(b) by using the output of a pattern generation section according to a compensated pattern). Therefore, when the above accuracy is unnecessary, it is permitted to omit the parameter compensation processings (steps S2-1 to S2-N) from the interference matrix creation procedure (FIG. 3(a)).

Moreover, though the procedure shown in FIGS. 3(a) and 3(b) creates an interference matrix for every parameter, it is also permitted to select an interference matrix for a proper specific parameter and apply the selected interference matrix to all parameters in common in order to simplify the interference matrix creation procedure. That is, it is also permitted to create only an interference matrix for a selected specific parameter and update (compensate) the specific parameter and the remaining parameters by using the interference matrix thus created. Accordingly, it is possible to omit the interference matrix creation procedures for the remaining parameters among the procedures shown in FIG. 3(a) (for example, when selecting the interference matrix of the parameter 1, it is enough to execute only step S1-1), thus greatly decreasing the time required for interference matrix creation.

For example, when each parameter is determined in accordance with a gain, it is possible to create a matrix including, as a factor, a transfer gain representative of the relation between a manipulated variable for a heat treatment furnace and a temperature value detected from the heat treatment furnace and apply the interference matrix to all parameters in common.

In this case, a transfer gain denotes the rate of change of a controlled variable (quantity) with respect to a slight or limited change of a manipulated variable (quantity) in a steady state. An interference matrix M using a transfer gain as a factor can be obtained by the procedure, for example, shown in FIG. 36 while the switcher 6-i is connected to the pattern generation section-8-i side in FIG. 2.

Figure 36:
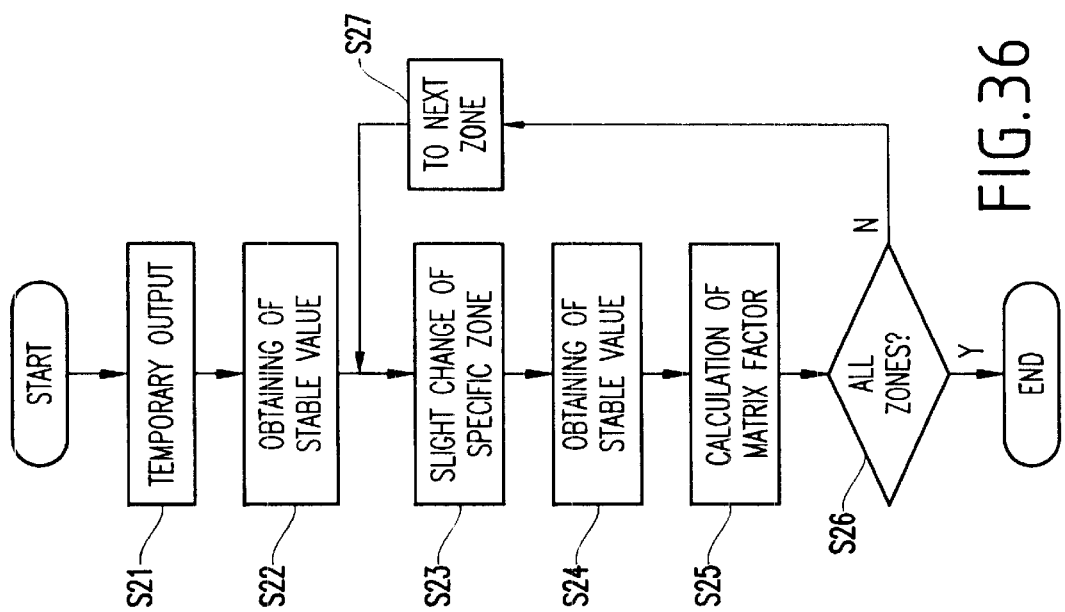
FIG. 36 is an illustration showing an interference matrix creation procedure.
Figure 35:
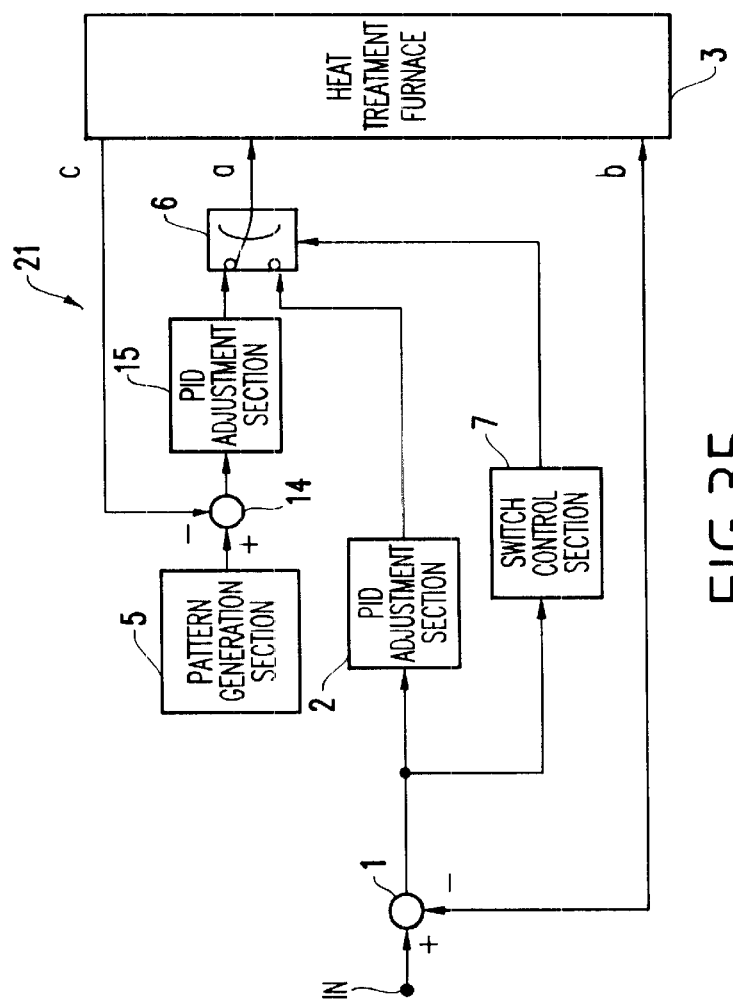
FIG. 35 is a third temperature control block diagram including a pattern generation section.

In FIG. 36, step S21 is a processing for setting an optional constant output ui from the pattern generator 8-i. Though the output value in the above case is not restricted, it is preferable to keep the stable value of the controlled variable obtained in the next step S22 to be mentioned later in a temperature range for performing process treatment (temperatures from $T_0$ to $T_1$ in FIGS. 32(a) and 32(b)), The output of the pattern generator 8-i in the above case is shown by a vector u.

$$u=[u_1\ u_2\ \Lambda\ \Lambda\ u_M]^T$$

Step S22 is a procedure for obtaining a value (temperature) when the detected value of a controlled variable is stabilized for manipulated variables inputted up to step S21. A stable value of a controlled variable in zones 1 to M obtained in the above case is shown by the following vector y.

$$y=[y_1\ y_2\ \Lambda\ \Lambda y_M]^T$$

Step S23 is a procedure for setting the output of the pattern generator 8-i of a certain zone j by shifting the output from the value set in step S21. by a slight amount $\Delta u_j$. Step S24 is the same procedure as in step S22. Step S25 is a processing for calculating a vector $m_j$ on the jth column of the interference matrix M by using two last-obtained stable value vectors.

$$m_j=(y-y')/\Delta u_j$$

In this case, y denotes the stable value of the last-obtained controlled variable and y' denotes the second last-obtained stable value. Specifically, when assuming that step S22 is executed after step S21 and then, step S24 is executed after step S23, the stable value obtained in step S25 is equal to y and the stable value obtained in step S22 is equal to y'. The interference matrix M is an M×M matrix shown by the following Equation using $m_j$.

$$M=[m_1\ m_2\ \Lambda\ \Lambda m_M]$$

Steps S26 and S27 are processings for instructing execution of steps S23 to S25 for all M zones. When execution of steps S23 to S25 has already been completed for all M zones, the interference matrix creation procedure is finished.

By creating an interference matrix in accordance with the procedure shown in FIG. 36, it is possible to omit the interference matrix creation procedure shown in FIGS. 3(a) and 3(b), in particular steps S12, S15 requiring a lot of time, thus greatly decreasing the time required for interference matrix creation.

Moreover, when interference matrixes of all parameters are set in accordance with the above procedures, it is possible to update (compensate) parameters in accordance with the procedure, for example, shown in FIGS. 4(a) and 4(b) by using these interference matrixes in order to set N parameters working on outputs of the pattern generation sections 8-i to optimum values. The compensation of parameters is performed by adding parameter compensation values obtained from the Equation (6) to the parameters set to the pattern generation section 8-i.

Then, a procedure for parameter update (compensation performed as required after the compensation described for FIGS. 3(a) and 3(b)) will be described below by referring to FIGS. 4(a) and 4(b). Though parameter compensation is performed also for the interference matrix creation in FIGS. 3(a) and 3(b) as required as described above, a series of procedures shown in FIGS. 4(a) and 4(b) are mainly performed in the case where it is decided that update of a parameter is necessary, and they are performed by about 1 to 3 cycles when parameter optimization (adjustment) is carried out before actual process treatment such as the time when parameters are updated due to a change in the ambient temperature caused, for example, upon starting a heat treatment furnace.

In the procedure shown in FIGS. 4(a) and 4(b), when performing the same processings as that shown in FIGS. 3(a) and 3(b), the processings are designated by the same symbols as in FIGS. 3(a) and 3(b). FIG. 4(a) shows a general flow chart. Steps S3-1, 3-2, and 3-N are processings for evaluating the result of parameter update performed in the last steps S2-1, 2-2, and 2-N and details are shown in FIG. 4(b). In FIGS. 4(a) and 4(b), steps S11, S12 and S13 are the same processings as those shown in FIGS. 3(a) and 3(b), and hence their description is omitted. The procedure shown in FIGS. 4(a) and 4(b) compensates parameters one by one. However, it is also permitted to compensate a plurality of parameters at the same time in order to simplify the procedure.

Figure 5:
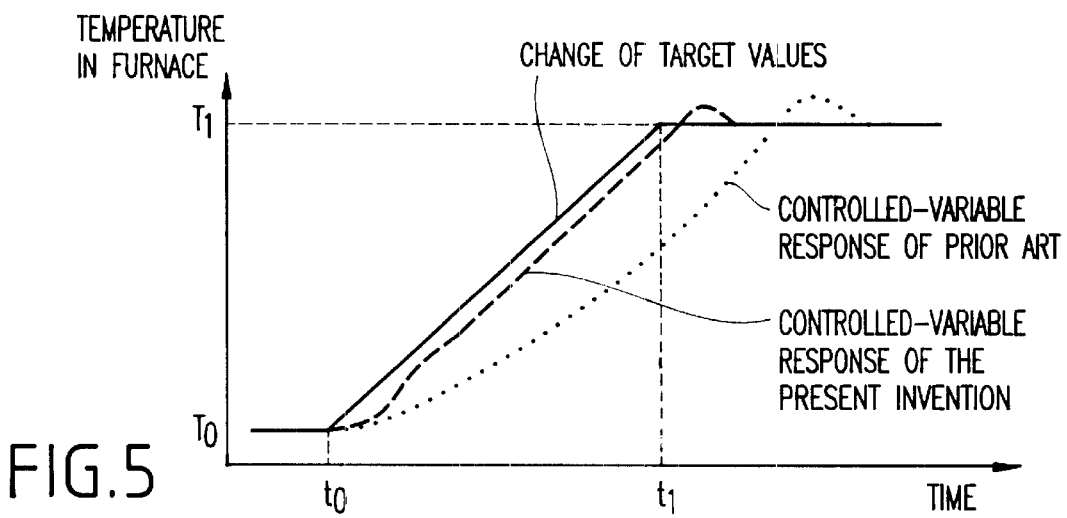
FIG. 5 is an illustration showing operation results of the first embodiment.

Then, a specific function and evaluation method for executing step S103 among the process treatments shown in FIGS. 32(a) and 32(b) are described below by using a control method of the present invention and referring to FIGS. 5 to 7. FIG. 5 shows the comparison of controlled-variable response between the prior art and the present invention, in which the change in the target temperature value is shown by a continuous line, the change in conventional controlled-variable (detected temperature value) response is shown by a dotted line, and the change in controlled-variable response of the present invention is shown by a broken line.

Figure 6:
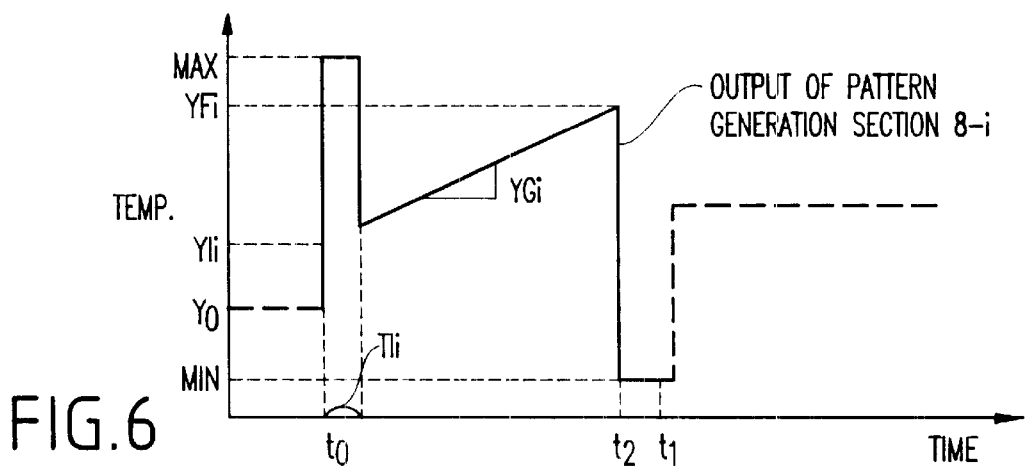
FIG. 6 is an illustration showing an output pattern of a pattern generation section of the first embodiment.
Figure 7:
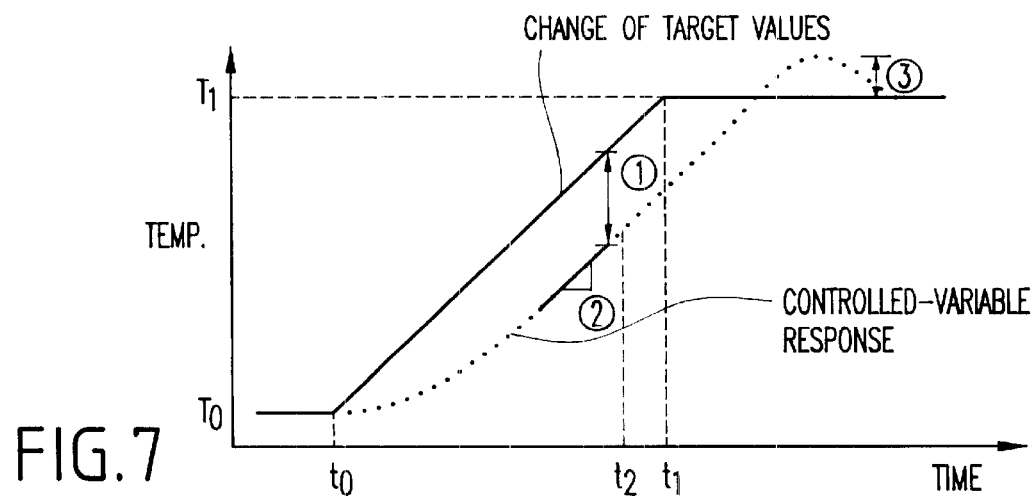
FIG. 7 is an illustration showing evaluation items of the first embodiment.

In FIGS. 5 to 7, symbol to denotes a target-temperature-rising start time and $t_1$ denotes a target-temperature-rising end time. A switcher 6-i is switched over to the second pattern generation section 8-i side in a period from time to until the time when a deviation between a target value and a controlled variable has changed to a value close to 0 (for some time after time $t_1$: for example, the period may be determined as 30 minutes or a time in which it can be detected that the deviation becomes a predetermined value such as 1% or less) so as to select the output end of the pattern generation section 8-i. For the time other than the above, the switcher 6-i selects the input end from a PID adjustment section 2-i. When the target value shown by the continuous line in FIG. 5 is set, a pattern shown by the following Equation (7) is set to the function $f$ of the pattern generation section 8-i of the present invention introduced through the Equation (1) as shown in FIG. 6.

$$f(t-t_0, TI_i, YI_i(\alpha YG_i), YG_i, YF_i)$$

$$= \begin{aligned} &\text{Max} &&, t_0 \le t < t_0 + TI_i \\ &YI_i + YG_i \cdot (t - t_0) &&, t_0 + TI_i \le t < t_2 \\ &\text{Min} &&, t_2 \le t \end{aligned} \quad (7)$$

In FIG. 6, symbol $t_2$ denotes the time when a linear function $YI_i+YG_i \cdot (t-t_0)$ reaches $YF_i$, $Y_0$ denotes a value inputted to a corresponding zone of a heat treatment furnace 3A when a controlled variable is stabilized at a temperature $T_0$, and $Y_0 \le YI_i$. Max and Min respectively denote a maximum value and a minimum value that can be inputted to the heat treatment furnace 3A. A signal from the switcher 6-i when the switcher 6-i selects the input end from the PID adjustment section 2-i such as before $t_0$ is shown by a broken line in FIG. 6. Moreover, $T_i$, $YI_i$, $YG_i$, and $YF_i$ denote four parameters. By setting the parameter $YI_i$ to a value a times larger than $YG_i$ (though not described in detail here, α is a constant determined in accordance with the characteristic of an electric furnace, which is a time constant when applying a secondary delay approximation $G(1+\alpha s)(1+\beta s)$ to the characteristic of the electric furnace under the condition $\alpha > \beta$), $YG_i$ and $YI_i$ are substantially represented by any one of the parameters.

FIG. 7 is an illustration of an evaluation method for creation of the interference matrixes shown in FIGS. 3(a) and 3(b) and update of the parameters shown in FIGS. 4(a) and 4(b). Among evaluations of four parameters, the evaluation item of $TI_i$ selects a deviation between a target value and a controlled variable several minutes before the time $t_2$ (or at the time $t_2$) as shown by (1) in FIG. 7; the evaluation item of $YG_i$ or $YI_i$ selects a controlled-variable rising speed several minutes before the time $t_2$ (or at the time $t_2$) as shown by (2) in FIG. 7; and the evaluation item of $YF_i$ selects a controlled-variable overshoot value after the time $t_1$ shown by (3) in FIG. 7. Evaluation values of these evaluation items are decided by the difference between controlled variables to the target value inputted to the adder 1-i. In the case of this embodiment, the deviation (1) is evaluated by the output value of the adder; the controlled-variable rising speed (2) is evaluated by the inclination of the output of the adder; and the controlled-variable overshoot value (3) is evaluated by using the maximum value (absolute value) of output values of the adder 1 after the time $t_1$. In any case, parameters using interference matrixes are updated so that these evaluation values become desired values.

Moreover, in update of parameters, the parameter TIi is first updated (corresponding to step S2-1 and step S3-1 in FIG. 4(a)), then the parameter YGi or YIi is updated (corresponding to step S2-2 and step S3-2 in FIG. 4(a)), and finally the parameter YFi is updated (corresponding to step S2-N and step S3-N at N=3 in FIG. 4(a)).

Though this embodiment uses an overshoot value as one of evaluation values, it is also possible to use, in place of the overshoot value, the deviation (output of an adder) between a target value and a controlled variable when a switcher is changed from the pattern generation section side to the PID adjustment side, thereby updating parameters so that the deviation becomes zero.

Moreover, it is possible to use the output from an unillustrated memory as the output of a pattern generation section by previously calculating a function output in which parameters are updated before executing heat treatment in accordance with temperature control as described above and storing the function output in the memory.

Thus, it is a matter of course that compensating parameters of the approximate function of the pattern generation section 8-i in accordance with controlled variables can be also applied to other embodiments of the invention to be described later.

Figure 8:
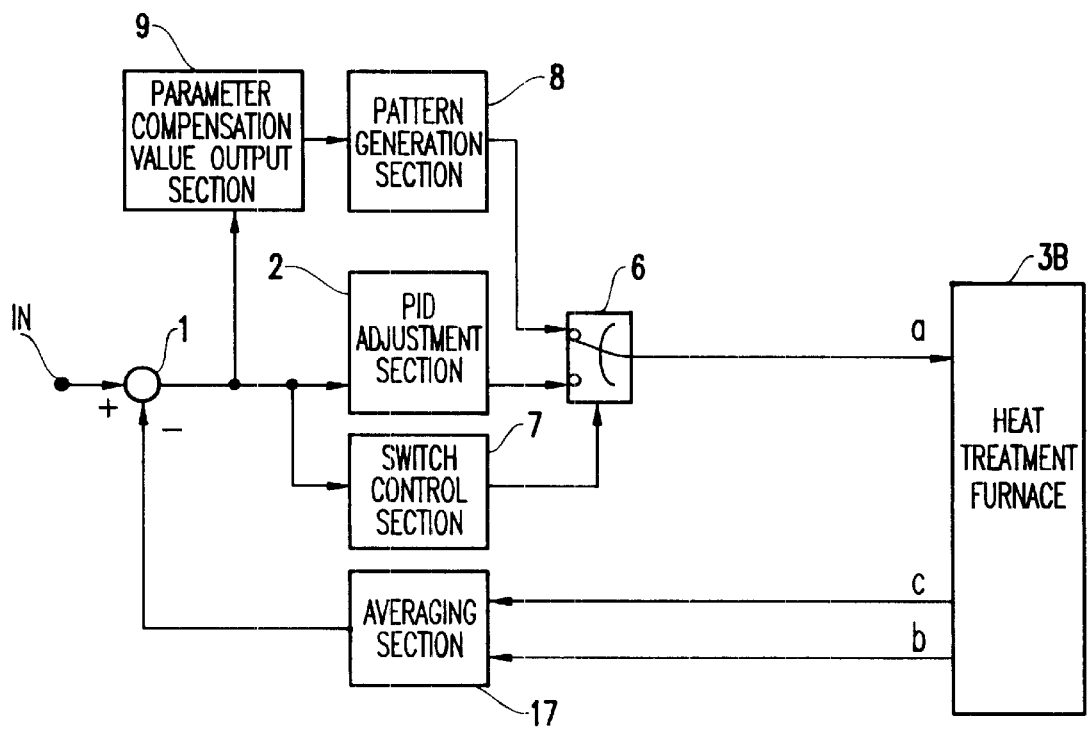
FIG. 8 is a block diagram showing a modification of the first embodiment.

FIG. 8 is a block diagram showing a modification of the first embodiment shown in FIG. 1, in which the components same as or equivalent to those in FIG. 1 are designated by the same symbols and their description is omitted.

Figure 29A:
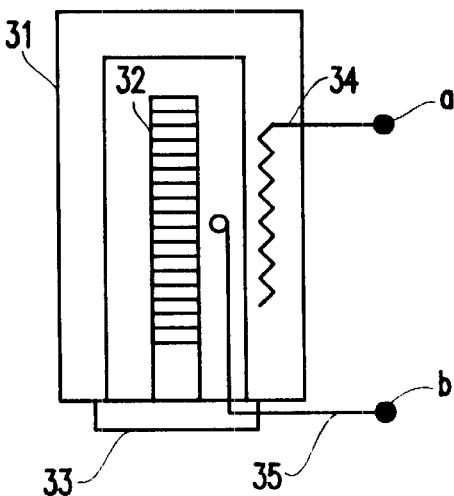
FIGS. 29(a) and 29(b) are schematic views showing a heat treatment furnace when one zone is used.
Figure 29B:
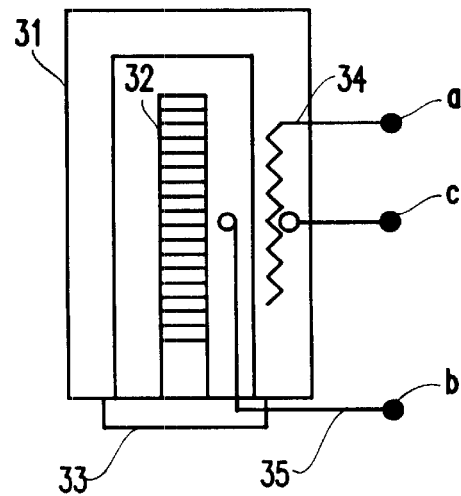

The heat treatment furnace 3B shown in FIG. 8 is the same as that shown in FIG. 29(b) and has a terminal b for outputting a first detected temperature value (controlled variable) and a terminal c for outputting a second detected temperature value (auxiliary controlled variable). Moreover, the first and second detected temperature values outputted from these two terminals a and b are inputted to the adder 1 through an averaging section 17.

The temperature controller previously averages a first detected temperature value and a second detected temperature value at a predetermined ratio and supplies the averaged output to the adder 1.

The above ratio is previously experientially calculated.

According to the above configuration, in addition to the aforesaid advantages of the first embodiment, further advantages can be obtained that it is possible to handle, as a controlled variable, a value obtained by averaging a plurality of temperature values detected at various points (e.g., two points) in a furnace with a predetermined ratio and stabilize the temperature in the furnace into a desired set temperature in a short time. Moreover, this modification can of course be applied to the embodiments to be mentioned later.

Embodiment 2

Figure 9:
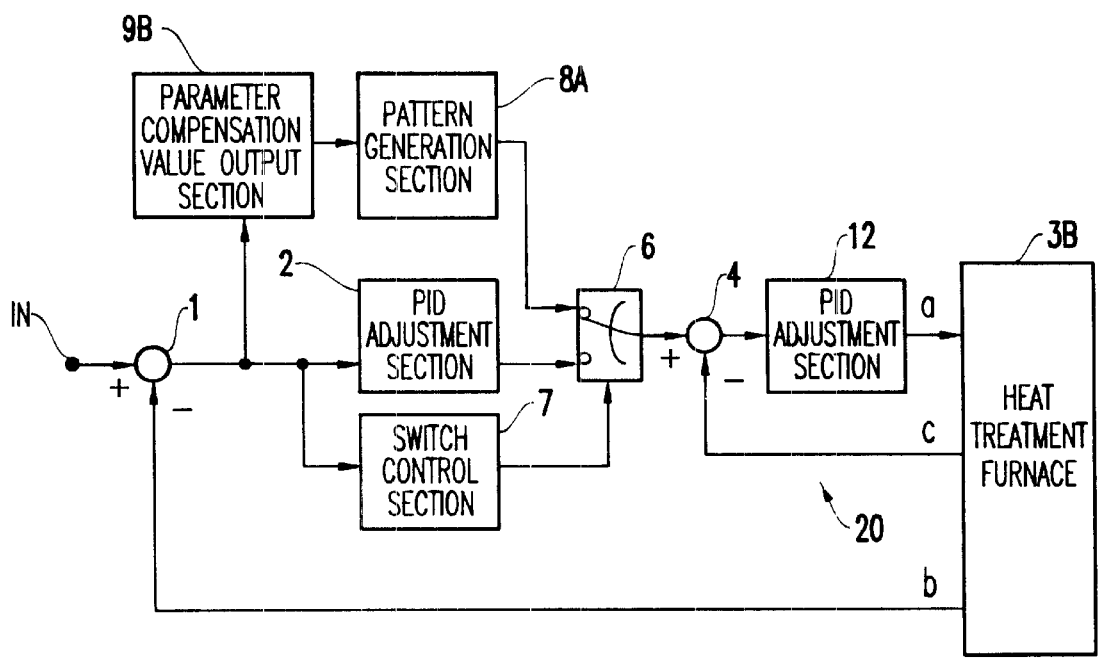
FIG. 9 is a control block diagram showing a second embodiment using one zone.
Figure 10:
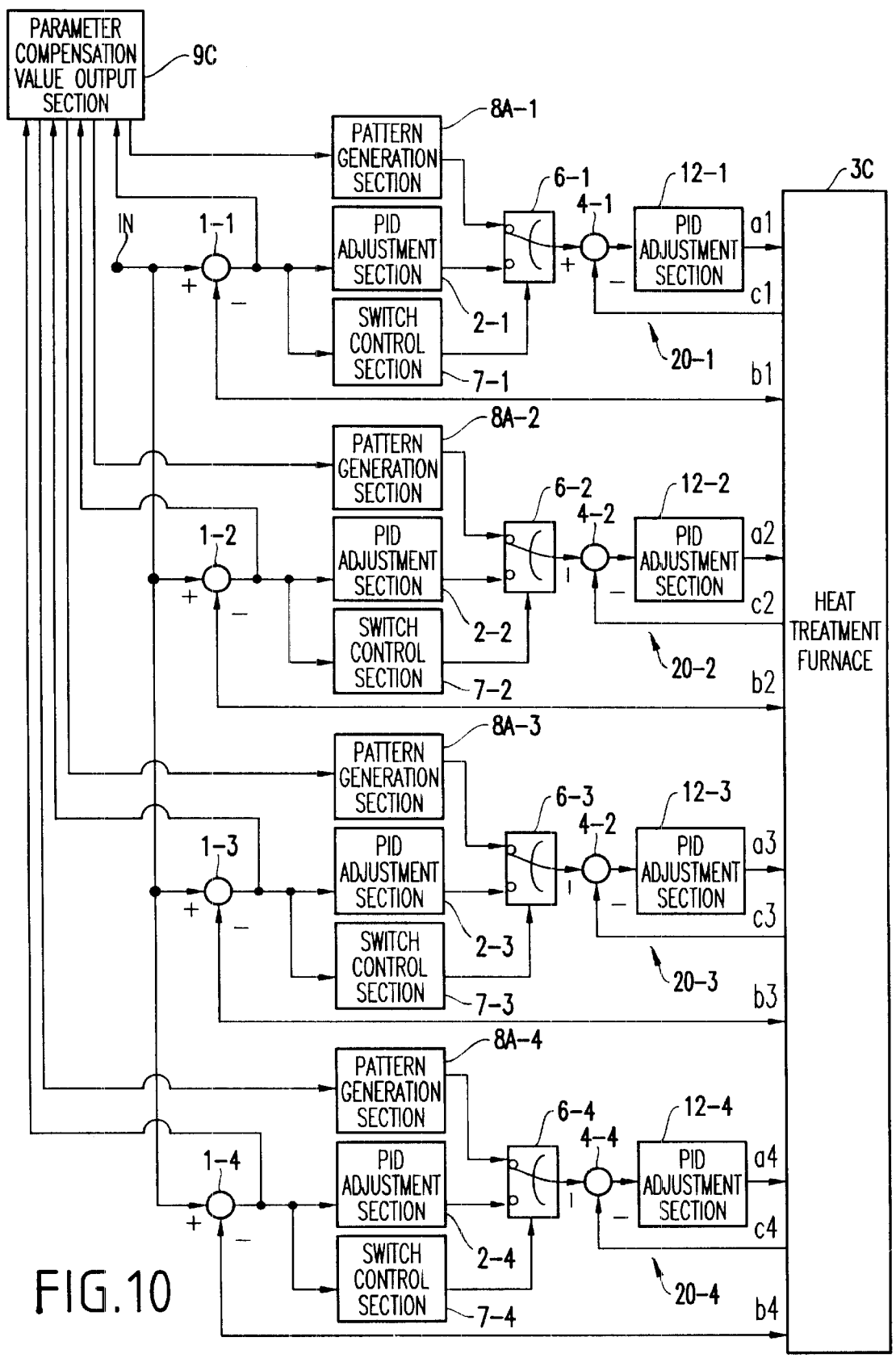
FIG. 10 is a control block diagram showing the second embodiment using four zones.

FIGS. 9 and 10 are control block diagrams showing a second embodiment of the invention, in which components same as or equivalent to those in FIG. 1 or 2 are designated by the same symbols.

The control block configuration shown in FIG. 9 further includes a PID adjustment section 12 at the rear stage of the switcher in the control block configuration shown in FIG. 1, and an adder 4 provided between the switcher 6 and the PID adjustment section 12, whereby a feedback loop 20 is formed for executing cascade control.

Moreover, the control block configuration shown in FIG. 10 is constituted so as to apply the configuration shown in FIG. 9 to a plurality of zones and has a structure for executing cascade control by further providing a PID adjustment section 12-i at the rear stage of each switcher 6-i in the control block configuration shown in FIG. 2, and an adder 4-i between a corresponding switcher 6-i and a corresponding PID adjustment section 12-i to constitute a feedback loop 20-i.

In this case, a second detected temperature value (auxiliary controlled variable) is outputted from the terminal c (or c-i) of the heat treatment furnace 3B (FIG. 9) or 3C (FIG. 10) and inputted to the adder 4 (or 4-i). Moreover, a first detected temperature value (main controlled variable) is outputted from the terminal b (or b-i) of the heat treatment furnace 3B and inputted to the adder 1 (or 1-i). The heat treatment section 3B shown in FIG. 9 is the same as that shown in FIG. 29(b), in which a temperature sensor 35 connected to the first detected temperature value terminal b is provided nearby a substrate in a reaction chamber and a temperature sensor connected to the second detected temperature value terminal c is provided nearby a heater 34.

According to the above cascade control, it is possible to reduce the fluctuation of response of the heat treatment furnace 3B by means of the feedback loop 20 when the response is changed, thereby improving the control response characteristic. Thus, it is possible to effectively use the second detected temperature value to improve the entire control performance.

The pattern generation section 8A (or 8A-i) of the second embodiment can use the following approximate function and parameters for pattern output.

$$f(t-t_0, TI_i, YG_i, YF_i),$$

$$= \begin{matrix} YI_i + YG_i \cdot (t-t_0), & t_0 \leq t < t_2 \\ YF_i, & t_2 \leq t \\ & i = 1, 2, \cdots M \end{matrix} \quad (8)$$

In the above Equation, t denotes a time variable, $t_0$ denotes a target-temperature-rising start time, $t_2$ denotes the time when $YI_i + YG_i \cdot (t-t_0)$ reaches $YF_i$, and parameters are shown by $YI_i$, $YG_i$, and $YF_i$.

Also in the second embodiment, interference matrix creation and pattern update (compensation) are performed in accordance with operations completely the same as the case of the first embodiment, and the same functions and advantages are obtained.

Moreover, in the case of the second embodiment, a rectangular change portion (corresponding to Max: parameter $TI_i$ of the first embodiment) is not provided for the approximate function because the PID adjustment section 12-i at the rear stage of the pattern generation section 8A-i has a differential factor. However, when the PID adjustment section 12-i is constituted of only an integral factor and a proportional factor, it is permitted to use the approximate function same as that of the first embodiment.

Figure 11:
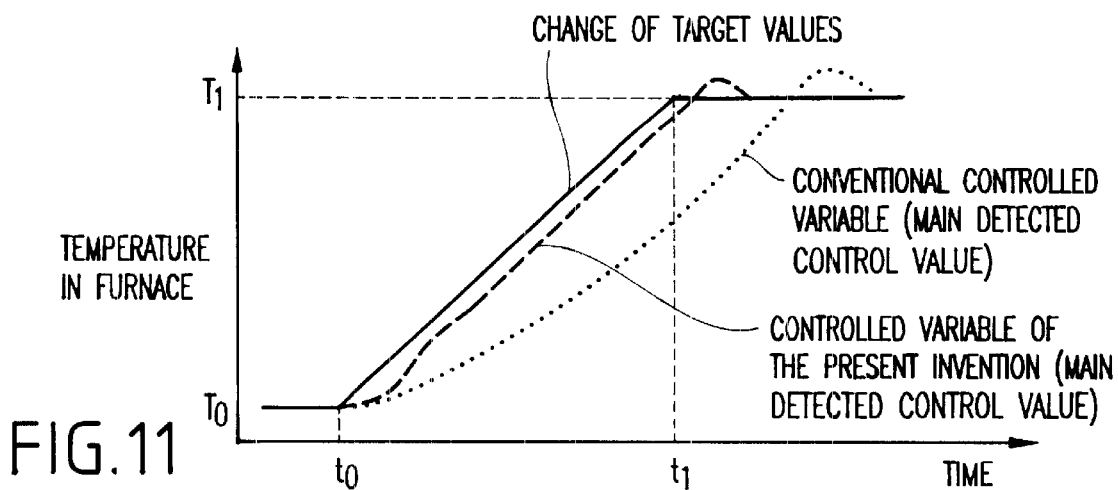
FIG. 11 is an illustration showing operation results of the second embodiment.

Then, a specific function and evaluation method for executing step S103 among the process treatments shown in FIGS. 32(a) and 32(b) are described below by referring to FIGS. 11 to 13. FIG. 11 shows the comparison of controlled-variable responses (first detected temperature value) between the prior art and the present invention, in which the change in the target value is shown by a continuous line, the change in controlled-variable response of the prior art is shown by a dotted line, and the change in controlled-variable response of the present invention is shown by a broken line.

In these figures, to denotes a target-temperature-rising start time and $t_1$ denotes a target-temperature-rising end time. The switcher 6-i is switched over to the pattern generation section 8A-i side in a period from time $t_0$ until the time when the deviation between a target value and a controlled variable has changed to a value close to 0 (for some time after the time t1 such as 30 min) so as to select the output end of the pattern generation section 8A-i. For the time other than the above, the switcher 6-i selects the input end from the PID adjustment section 2-i. When the target value shown by a continuous line in FIG. 11 is set, the function f of the pattern generation section 8A-i can use the above Equation (8). In this Equation, I denotes a time variable, to denotes a target-temperature-rising start time, and parameters are shown by $YI_i$, $YG_i$, and $YF_i$.

Figure 12:
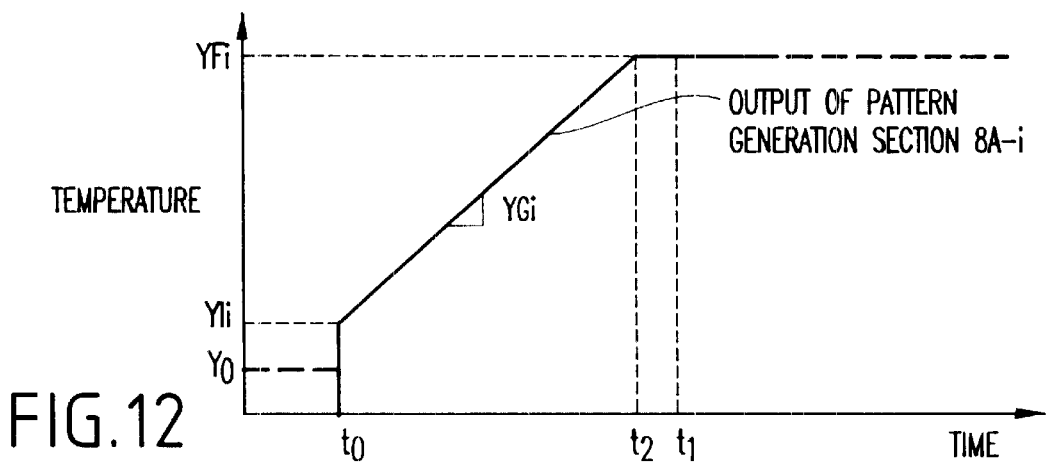
FIG. 12 is an illustration showing an output pattern of a pattern generation section of the second embodiment.

FIG. 12 shows a pattern shown by the Equation (8), in which $t_2$ denotes the time when a linear function $YI_i + YG_i \cdot (t-t_0)$ reaches $YF_i$, and $Y_0$ denotes a value (manipulated variable) inputted to a corresponding zone of the heat treatment furnace 3C when a controlled variable (first detected temperature value) is stabilized at a temperature $T_0$ under the condition $Y_0 \leq YI_i$. A signal from the switcher 6-i when the switcher 6-i selects the input end from the PID adjustment section 2-i before time $t_0$ is shown by a broken line in FIG. 12.

Figure 13:
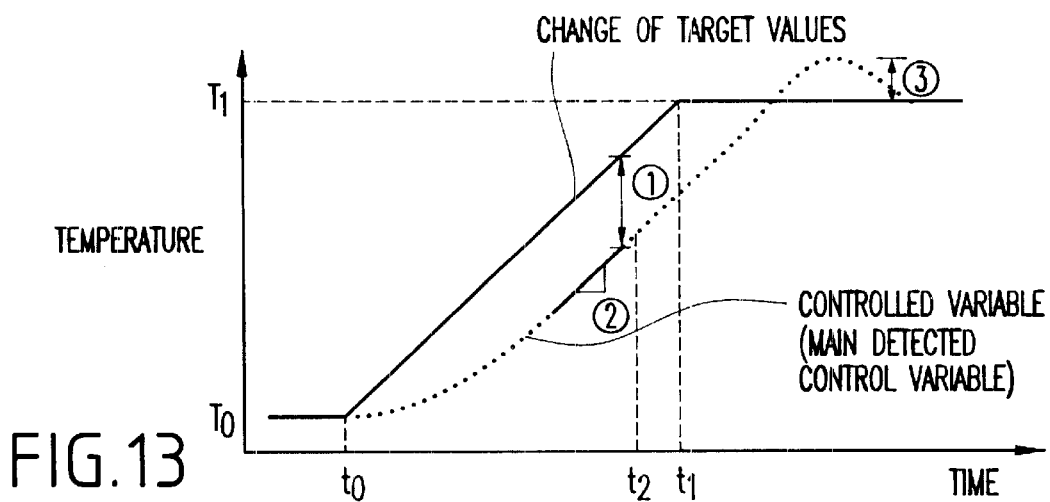
FIG. 13 is an illustration showing evaluation items of the second embodiment.

Moreover, FIG. 13 is an illustration of an evaluation method for the interference matrix creation shown in FIGS. 3(a) and 3(b) and the parameter update shown in FIGS. 4(a) and 4(b). Among evaluations for three parameters, the evaluation item of $YI_i$ selects a deviation between a target value and a controlled variable at $t_2$ (or immediately before $t_2$) shown by (1) in FIG. 12, the evaluation item of $YG_i$ selects a controlled-variable rise speed at $t_2$ (or immediately before $t_2$) shown by (2) in FIG. 12, and the evaluation item of $YF_i$, selects a controlled-variable overshoot value after $t_1$ shown by (3) in FIG. 12.

Evaluation values of these evaluation items are decided in accordance with the difference between a target value inputted to the adder 1-i and a detected control value. This embodiment evaluates the deviation (1) in accordance with the output value of the adder, the controlled-variable rise speed (2) in accordance with the inclination of the output of the adder, and the controlled-variable overshoot value (3) by using the maximum value (in absolute value) of output values of the adder 1 after the time t1, In any case, the parameters using interference matrixes are updated so that these evaluation values become desired values.

Then, modifications of the second embodiment are described below.

In a first modification of the second embodiment, as shown in FIG. 17A, when the output of the switcher 6 is switched over from the output of a pattern generation section 8A' to the output of a PID adjustment section 2' by means of a switch control section 7', the output value of the PID adjustment section 2' immediately after the switch-over of the switcher 6 is adjusted in accordance with the output value of the pattern generation section 8A' generated immediately before the switch-over of the switcher 6.

The above adjustment is performed by using the output of the pattern generation section generated immediately before the switch-over of the switcher 6 directly as a preset value or by using a combined value between the output value of the pattern generation section generated immediately before the switch-over of the switcher 6 and the output of the pattern generation section generated in a stable state (steady state) thereof.

Then, a specific function and evaluation method when performing the processing in step S102 shown in FIG. 32(b) with the above configuration will be described below by referring to FIGS. 14(a), 14(b) and 15.

Figure 14A:
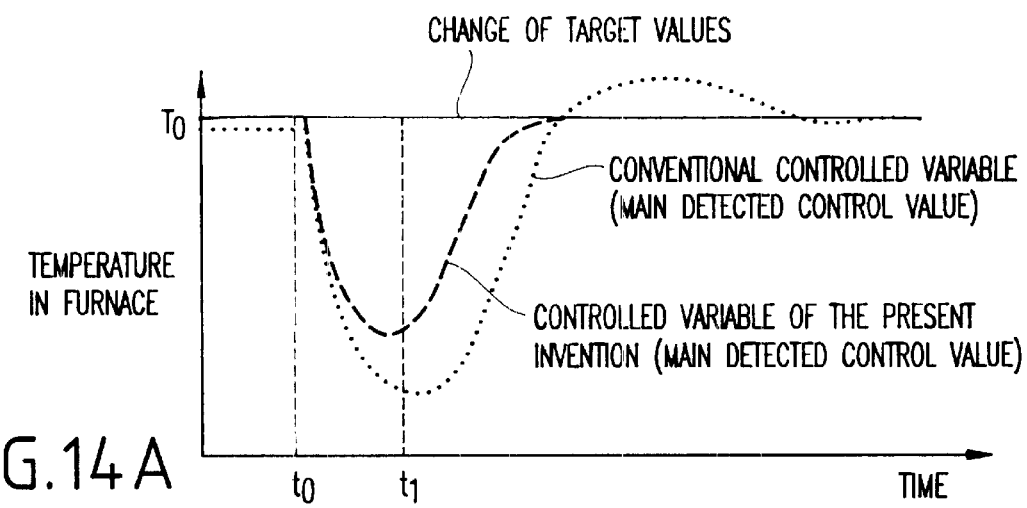
FIGS. 14(a) and 14(b) are illustrations for explaining the operation of a modification of the second embodiment.

FIG. 14(a) shows the comparison between the prior art and the modification of the second embodiment, in which the change in the target value is shown by a continuous line, the change in conventional controlled-variable response (first detected temperature values) is shown by a dotted line, and the change in controlled-variable response of the present invention is shown by a broken line. Symbol to denotes a boat-loading start time and to denotes a boat-loading end time. A switcher selects the input end from a pattern generation section in a period from time $t_0$ until the time when the deviation between a target value and a controlled variable (first detected temperature value) becomes a value close to zero after time $t_1$. In the time other than the above period of time, the switcher selects the input end from a PID adjustment section. At the time of boat loading, it is preferable to use the pattern shown by the following Equation (9) for the function f of the pattern generation section introduced by the Equation (1) as shown in FIG. 14(b).

$$f(t-t_0,\ YI_i,\ YG_{i),-}YI_1,+YG_i\times(t-t_0)\ t_0 \leq t,\ i=1, 2, \ldots M \quad (9)$$

Figure 17:
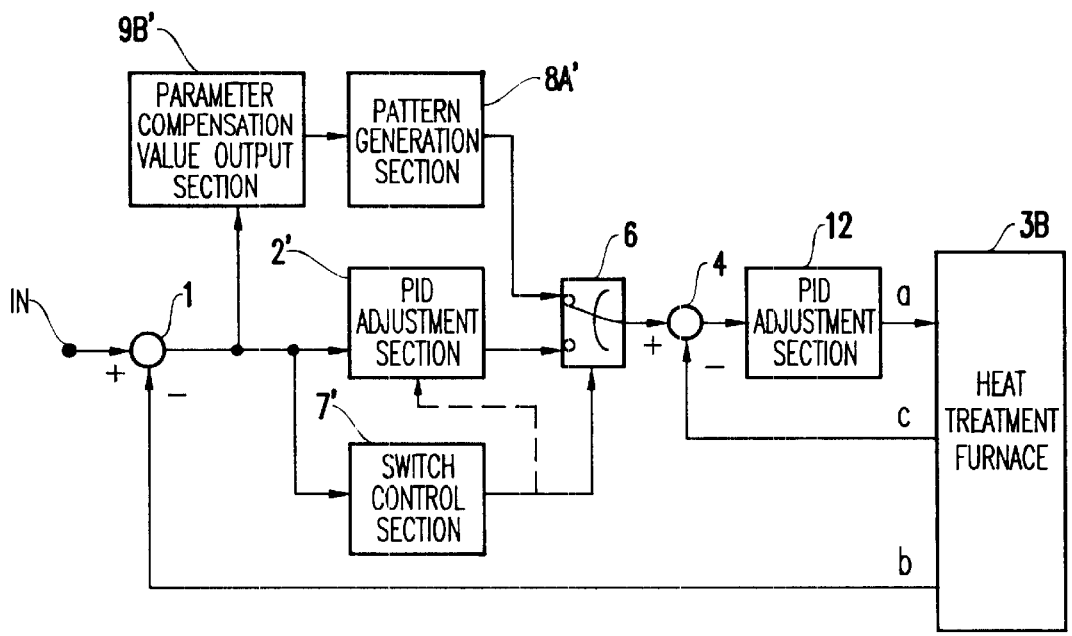
FIG. 17 is a block diagram showing a first modification of the second embodiment.

In this case, when changing the output of the switcher 6 from the output of the pattern generation section 8A' to the output of the PID adjustment section 2', the PID adjustment section 2' receives the output value of the pattern generation section 8A' at switching control timing from the switch control section 7' and adjusts its output immediately after the switch-over of the switcher 6 as shown in FIG. 17.

Figure 14B:
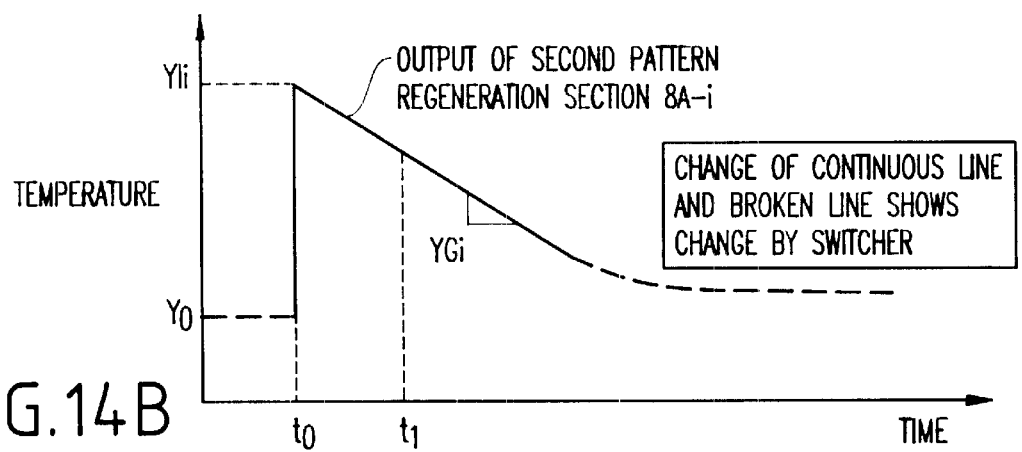

According to the above configuration, when the output of a pattern generation section is changed to the output of a PID adjustment section with the pattern shown in FIG. 14(b), even if the output pattern of the pattern generation section changes every moment and besides it is unknown when (at what point of time) a switching condition is satisfied, it is possible to preset the output of the PID adjustment section to an optimum value upon switching-over of the switcher, whereby the switch-over operation can be effected in a smooth manner even during a transient state (other than a stable state) without giving rise to large output fluctuations before and after the switch-over and hence any vibration of a controlled variable.

Figure 15:
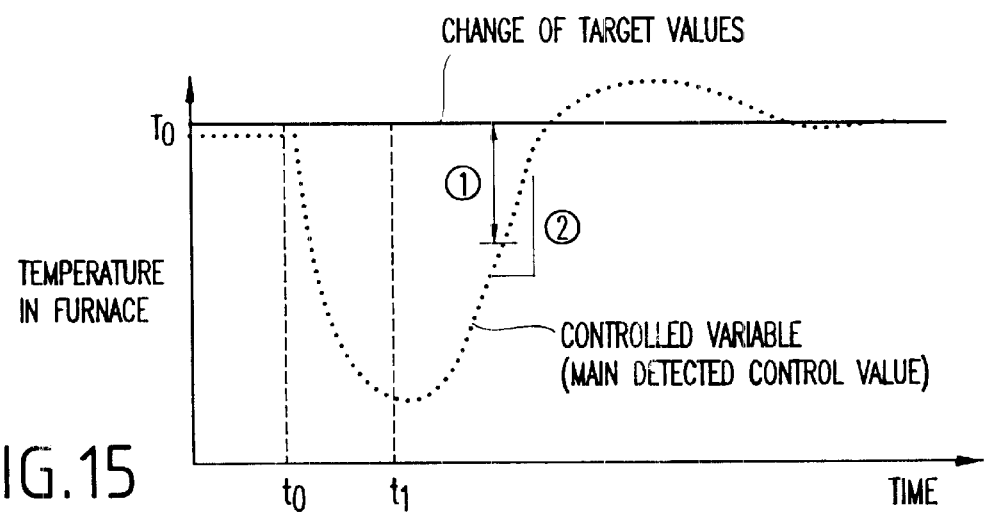
FIG. 15 is an illustration showing interference matrix creation and evaluation items.

FIG. 15 is an illustration of an evaluation method for interference matrix creation and parameter update. Among evaluations of two parameters, the evaluation of $YI_i$ selects the deviation between a target value and a controlled variable (first detected temperature value) at a predetermined time shown by (1) in FIG. 15 and the evaluation of $YG_i$ selects the controlled-variable rising or falling speed nearby the predetermined time shown by (2) in FIG. 15.

Then, a second modification of the second embodiment will be described below by referring to FIG. 18.

In the second modification, when the output of a switcher 6 is switched over from the output of the PID adjustment section 2" to the output of the pattern generation section 8A" by means of a switch control section 7", the output value of a pattern generation section 8A" immediately after the switching-over is adjusted in accordance with the output value of the PID adjustment section 2" generated immediately before the switching-over.

The pattern generation section 8A" is adjusted in accordance with Equations (8)' and (9)' to be mentioned later.

In the case of actual temperature control, if the circumferential (equipment) environment or heat treatment characteristic is changed in a long term, a second detected temperature value nearby a heater is subject to the influence of such a change, so that a change may occur in the relative relation of the second detected temperature value to a first detected temperature value. For example, when an ambient air temperature becomes lower or higher than ordinary temperature or when a power-supply voltage becomes lower or higher than normal voltage, the cooling efficiency changes in the former case and the power to be supplied to a furnace changes from a designated voltage in the latter case. Therefore, the output of a PID adjustment section is stabilized at a value larger (smaller) than normal value. That is, the influence of change in the circumferential environment appears on the magnitude of the output value of the PID adjustment section under a stable state.

When control is performed by an output from the pattern generation section while ignoring the above change, the temperature in the furnace naturally becomes lower (higher) than ordinary temperature and an error In following a target temperature value occurs. Therefore, this example compensates for the disadvantage of the open-loop control by the pattern generation section for the above long-term fluctuation. Thus, by using a pattern shown by the following Equation (8)' or (9)' which are obtained by correcting the above-mentioned Equation (8) (when raising the temperature in the furnace to a process temperature: step S103) or the above-mentioned Equation (9) (when loading a boat into the furnace: step S102), respectively, it is possible to absorb the long-term changes and decrease fluctuations.

$$f(t-t_0, \Delta YI_i, YG_i, \Delta YF_i) = \Delta YI_i + YG_i \times (t-t_0) + Y_0, \; t_0 \leq t < t_2 \quad (8)$$

$$\Delta YF_i + Y_0, \; t_2 \leq t \; f(t-t_0, \Delta YI_i, YG_i) = \Delta YI_i + YG_j \times (t-t_0) + Y_0, \; t_0 \leq t, \; i=1, 2, \ldots M \quad (9)'$$

Figure 16A:
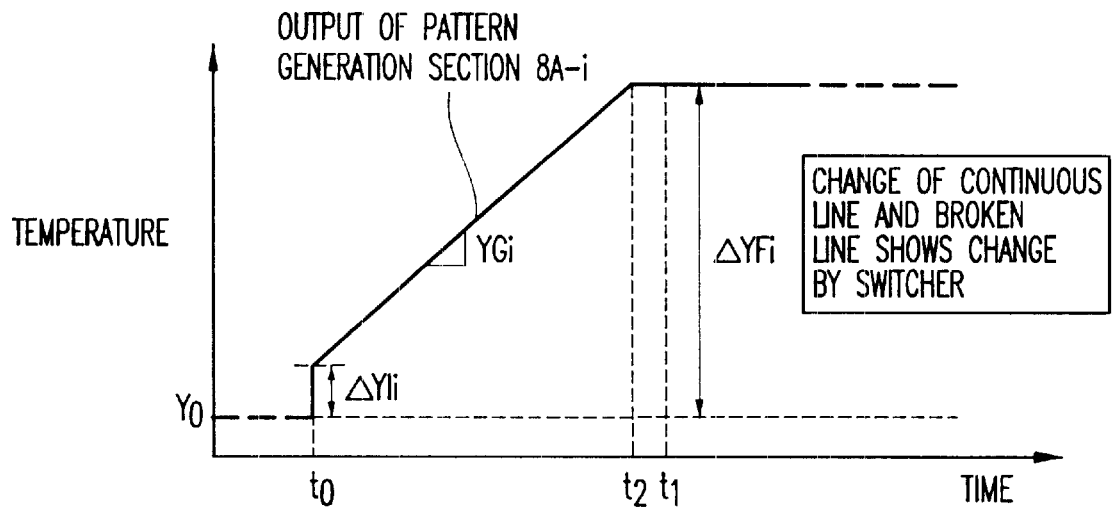
FIGS. 16(a) and 16(b) are illustrations showing outputs of the pattern generation section of a second modification of the second embodiment.
Figure 16B:
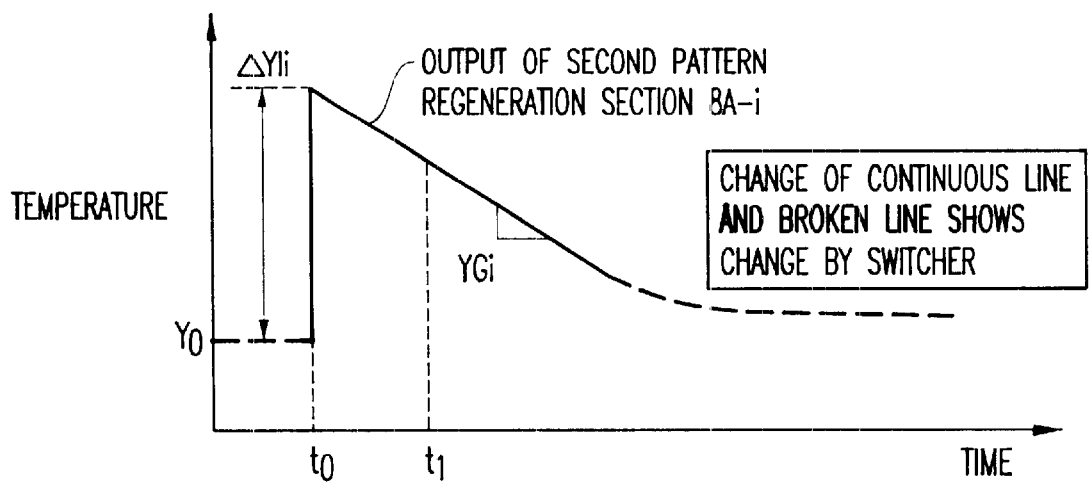

In the above Equations, $\Delta YI_i$ and $\Delta YF_i$ denote differences of $YI_i$ and $YF_i$ from $Y_0$. To show the above mentioned by drawings, FIG. 16(a) is used instead of FIG. 12 and FIG. 16(b) is used instead of FIG. 14(b). Moreover, $Y_0$ denotes the output value of the PID adjustment section 2" immediately before switching-over (that is, at $t_0$)

Figure 18:
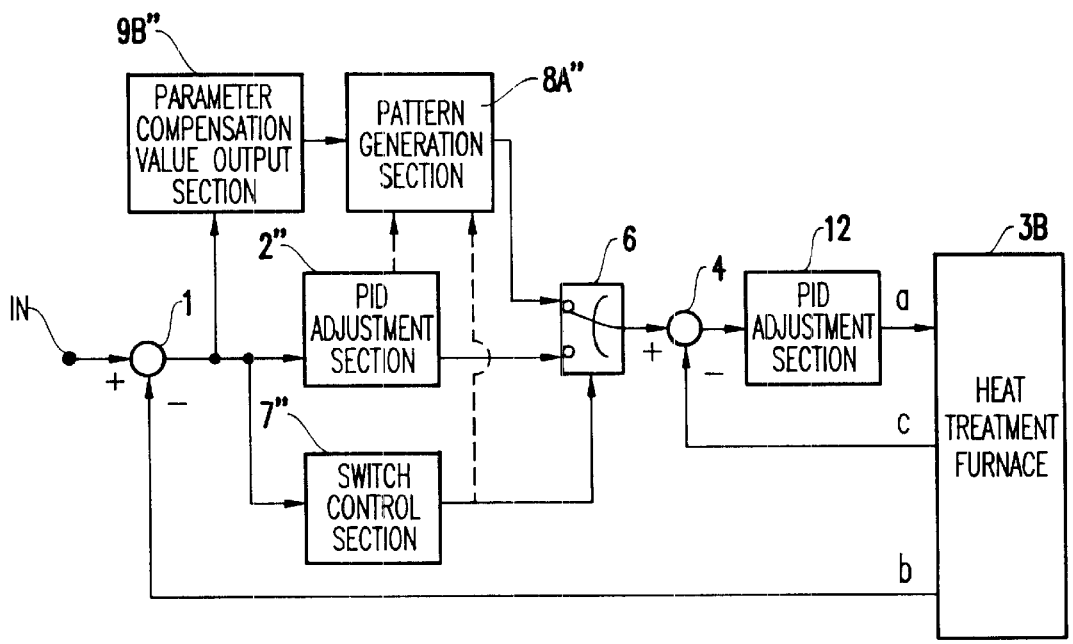
FIG. 18 is a block diagram showing the second modification of the second embodiment.

In the case of the configuration shown in FIG. 18, the pattern generation section 8A" receives the output value of the PID adjustment section 2" and adjusts its output value immediately after switching over to the pattern generation section 8A". This configuration makes it possible to preset an optimum value when a PID adjustment section is switched over to a pattern generation section, thereby compensating for the long-term fluctuation of a second detected temperature value produced when the circumferential (equipment) environment or heat treatment characteristic is changed in a long term.

It is a matter of course that the above-mentioned modifications of the second embodiment, that is, upon switching over the output of the switcher 6-i, adjusting the output of the switcher 6-i immediately after the switching-over in accordance with the output value of the switcher 6-i generated immediately before the switching-over, can be applied to other embodiments.

Embodiment 3

Figure 19:
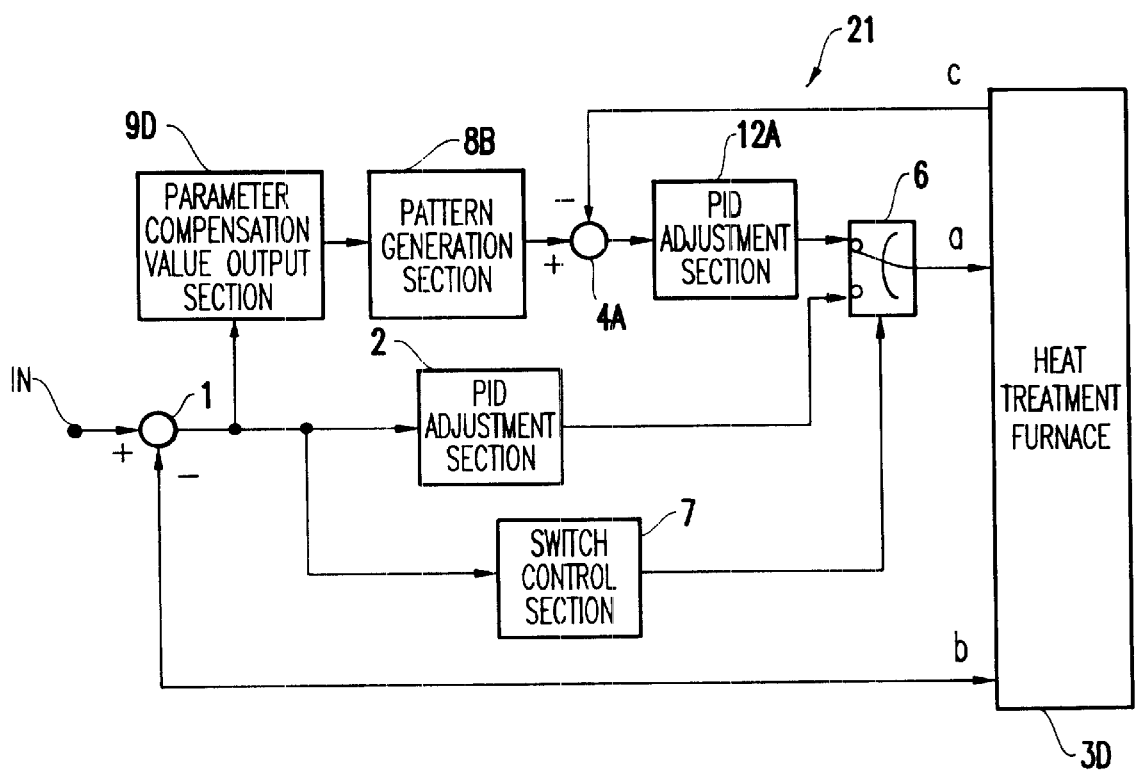
FIG. 19 is a control block diagram showing a third embodiment using one zone.
Figure 20:
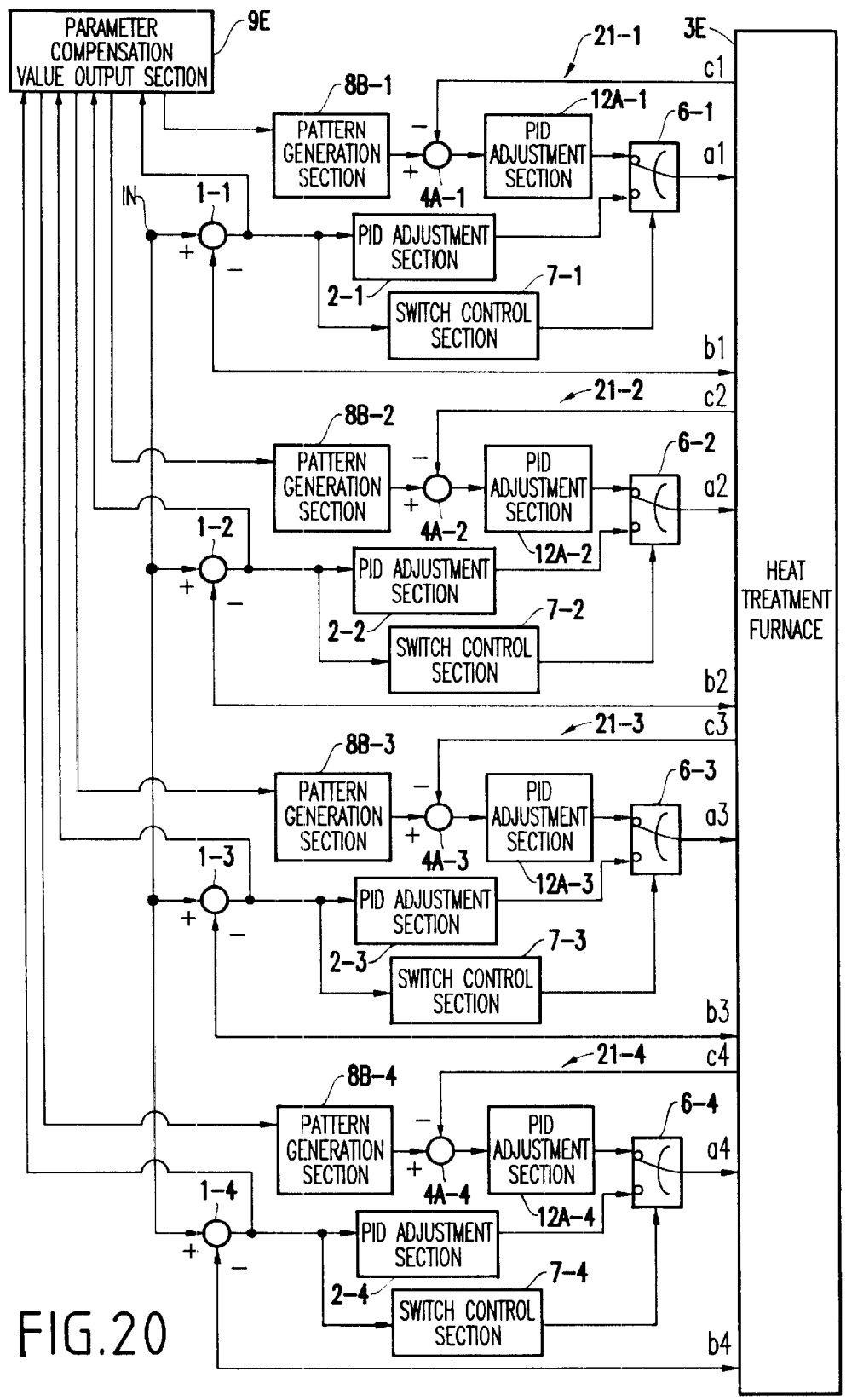
FIG. 20 is a control block diagram showing the third embodiment using four zones.

FIGS. 19 and 20 are block diagrams showing a third embodiment of the invention, in which components same as or equivalent to those in FIG. 1 or 2 are designated by the same symbols. The control block configuration shown in FIG. 19 includes an adder 4A and a PID adjustment section 12A between the input side of the switcher 6 and the pattern generation section 8 in the control block configuration shown in FIG. 1 and has a structure in which the adder 4A and the PID adjustment section 12A constitute a feedback loop 21.

Moreover, the control block configuration shown in FIG. 20 is constituted so as to apply the configuration of FIG. 19 to a plurality of zones and has a structure in which an adder 4A-i and a PID adjustment section 12A-i are provided between the input side of the switcher and the output side of the pattern generation section in the control block configuration shown in FIG. 2, and the adder 4A-i and the PID adjustment section 12A-i constitute a feedback loop 21-i.

In this case, in a heat treatment furnace 3D (FIG. 19) or 3E (FIG. 20), a second detected temperature value (auxiliary controlled variable) is outputted from a terminal c (or c-i) and inputted to an adder 4A (or 4A-i). Moreover, a first detected temperature value (main controlled variable) is outputted from the terminal b (or b-i) of the heat treatment furnace 3D (or 3E) and inputted to an adder 1 (or 1-i). The heat treatment furnace 3D shown in FIG. 19 is the same as that shown in FIG. 29(b), a temperature sensor connected to a first detected temperature value terminal b is provided nearby a substrate in a reaction chamber, and a temperature sensor connected to a second detected temperature value terminal c is provided nearby a heater 34 (see FIG. 29(b)).

The pattern generation section 8B (or 8B-i) of the third embodiment is used to output the following approximate function and parameters similar to the case of the second embodiment.

$$f(t-t_0, YI_i, YG_i, YF_i) = YI_i + YG_i \cdot (t-t_0), \; t_0 \leq t < t_2 \; YF_i, \; t_2 \leq t \; i=1, 2, \ldots M \quad (9)$$

In the above Equation (9), t denotes a time variable; $t_0$ denotes a temperature-rising start time; $t_2$ denotes the time when $YI_{i+YG_i}(t-t_0)$ reaches $YF_i$; and parameters are shown by $YI_i$, $YG_i$, and $YF_i$.

Also, in the case of the above-described third embodiment, interference matrix creation and parameter update (compensation) are performed in accordance with operations completely similar to those of the second embodiment, and functions and advantages same as those shown in FIGS. 11 to 13 are obtained.

Then, modifications of the third embodiment will be described below.

Figure 21:
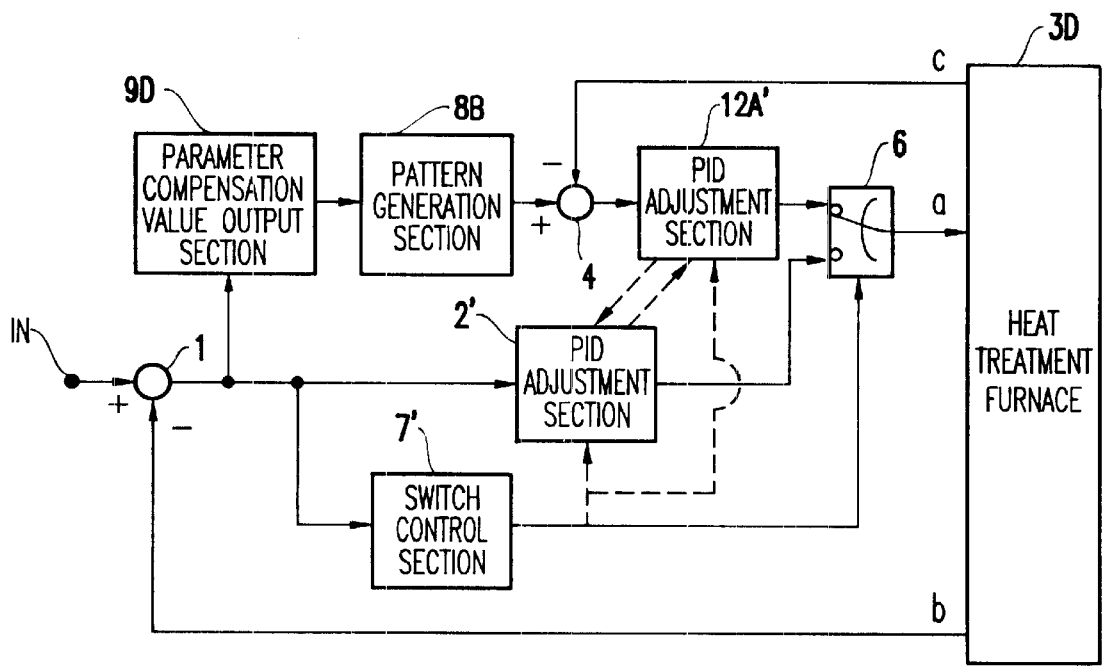
FIG. 21 is a block diagram showing a first modification of the third embodiment.

The configuration shown in FIG. 21 is a block diagram showing a first modification, in which the data and data flow shown by broken lines are added to the configuration shown in FIG. 19.

In FIG. 21, a switch control section 7' is constituted so as to output a switch control signal for controlling a switcher 6 to PID adjustment sections 2' and 12A'. The PID adjustment section 2' is constituted so as to perform PID operation in accordance with the output of the adder 1, output the operation result to the switcher 6, receive the output value of the PID adjustment section 12A' immediately before switching over of the switcher 6 or an integral value of the PID operation when the switcher 6 switches over the output of the PID adjustment section 12A' to the output of the PID adjustment section 2', and adjust an initial output value or integration preset value of the PID adjustment section 2' immediately after the switching-over.

The PID adjustment section 12A' is similarly constituted so as to perform PID operation in accordance with the output of the adder 4, output the operation result to the switcher 6, receive the output value of the PID adjustment section 2' immediately before switching over of the switcher 6 or an integral value of the PID operation when the switcher 6 switches over its output to the heat treatment furnace 3D from the output of the PID adjustment section 2' to the output of the RPD adjustment section 12A', and adjust the initial output value or integration preset value of the PID adjustment section 12A' immediately after the switching-over.

Thus, the output value of a PID adjustment section is adjusted properly when PID adjustment sections are switched over, so that an input value (manipulated variables) at the input end a of the heat treatment furnace 3D before and after switching over of the switcher is not made improper.

Moreover, the operations of the third embodiment shown in FIG. 21 are the same as those of the first and second modifications of the second embodiment shown in FIGS. 17 and 18 and the same functions and advantages can be obtained in the boat loading processing and in the processing for raising the temperature in a furnace to a process temperature.

Figure 22:
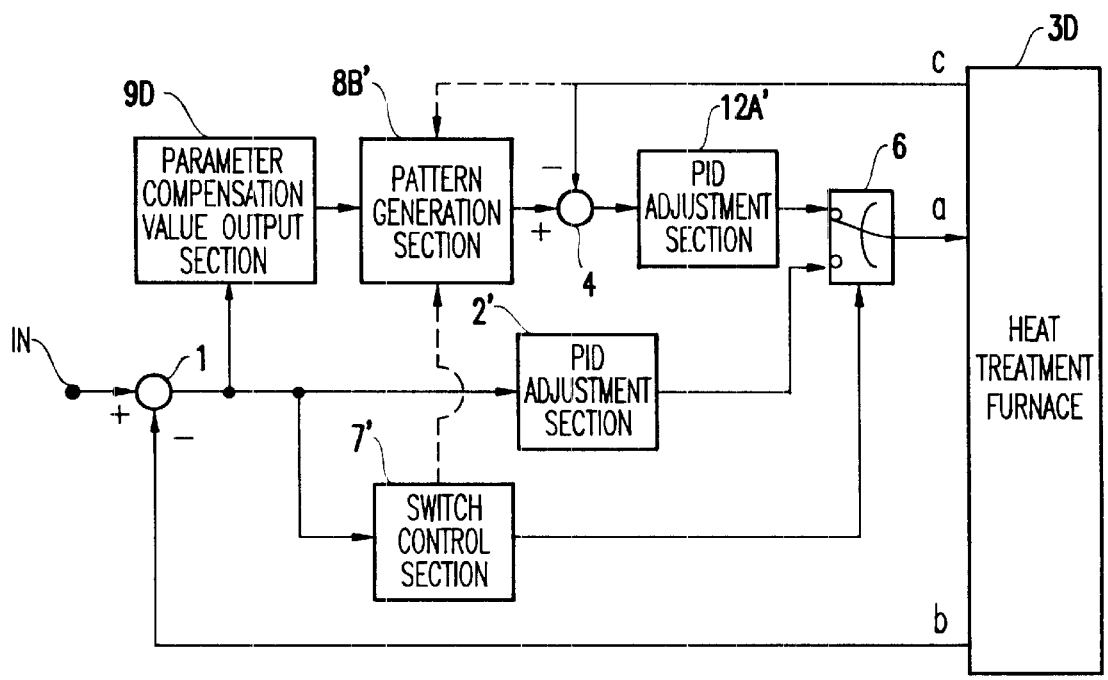
FIG. 22 is a block diagram showing a second modification of the third embodiment.

FIG. 22 is a block diagram showing a second modification of the third embodiment.

In FIG. 22, a switcher 6 is constructed such that when the switcher 6 changes over the output of a PID adjustment section 2' to the output of a PID adjustment section 12A', it receives the output value (second detected temperature value) supplied from the output terminal c of a heat treatment furnace immediately before switching-over of the switcher 6 at a switching control timing supplied from a switch control section 7' and adjusts the output value of a pattern generation section 8B' immediately after the switching-over.

This configuration makes it possible to preset the output value of the pattern generation section 8B' an optimum value when the switcher 6 changes over the output of a PID adjustment section 2' to the output of a PID adjustment section 12A', the output value of the pattern generation section 8B', thereby compensating for the long-term fluctuation of a second detected temperature value produced when the circumferential (equipment) environment or heat treatment characteristic is changed in a long term.

According to the above configuration, it is possible to effect stable temperature control even if the environmental condition fluctuates.

Embodiment 4

Figure 23:
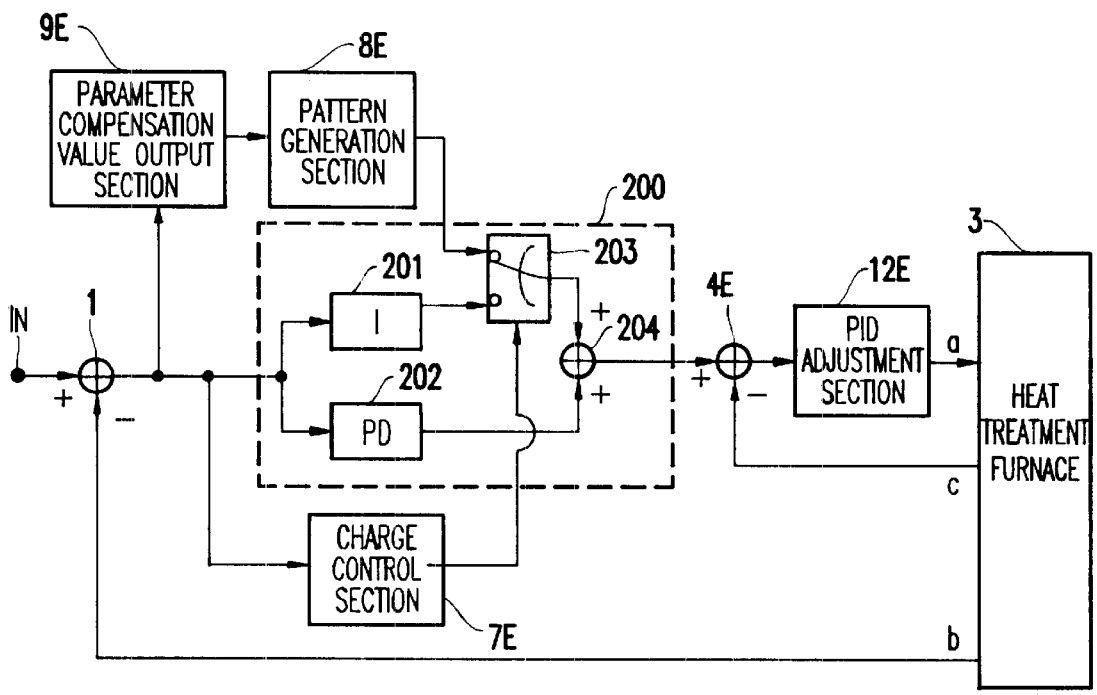
FIG. 23 is a block diagram showing a fourth embodiment.

FIG. 23 is a block diagram showing a fourth embodiment of the invention,

The fourth embodiment comprises an I adjustment section 201 (third adjustment section) provided with an I element to which the target temperature value of a heat treatment furnace 3 and a first detected temperature value supplied from the heat treatment furnace 3 are inputted through an adder 1, a PD adjustment section 202 fourth adjustment section) unprovided with an I element, a pattern generation section 8E having an approximate function for calculating a pattern output and changing a pattern outputted therefrom in accordance with parameters of the approximate function, a parameter compensation value output section SE connected to an output side of the adder 1 to output a parameter compensation value of the pattern generation section 8E in accordance with an output of the adder 1, a switch in the form of a switch element comprising a switcher 203 and an adder 204 for switching over a summed output of the output of the I adjustment section 201 and the output of the PD adjustment section 202 to another summed output of the output of the pattern generation section 8E and the output of the PD adjustment section 202, by changing the output of the I adjustment section 201 to the output of the pattern generation section 8E, and an adjustment section 12E (second adjustment section) to which an output of the switch element (output of the adder 204) and a second detected temperature value supplied from the heat treatment furnace 3 are inputted through an adder 4E to output a manipulated variable to the heat treatment furnace 3.

According to the above configuration, if an external disturbance related to a gain occurs while the pattern generation section 8E outputs data, the PD adjustment section 202 operates to suppress the external disturbance so that good control can be performed. Thus, the PD adjustment section 202 serves as an external disturbance adjuster.

The fourth embodiment up to a seventh embodiment to be mentioned later are constructed such that a heat treatment furnace and a PD adjustment section together form a closed loop while a pattern generation section is in operation, whereby the output of the PD adjustment section is added to the output pattern of the pattern generation section. As a result, when creating an interference matrix using a gain, it is possible to create a matrix G using a transfer gain representative of the relation between a manipulated variable and a main detected controlled variable (first detected temperature value) for each factor and then create an interference matrix in accordance with the following Equation (10) by using an unit matrix Eu and the matrix G thus created. In this case, the interference matrix thus obtained can be made common to a particular parameter.

$$M = (Eu + G \times K_p)^{-1} \times G \quad (10)$$

The transfer gain is defined as the ratio of a change in a controlled variable to a slight or limited change of a manipulated variable under a steady state. In the above Equation (10), assuming a P (proportional) constant of an integration switching PID adjustment section for each zone as kpi, Kp denotes a diagonal matrix using the P constants as diagonal factors.

$$Kp = diag(kp1, kp2, \Lambda, kpM) = \begin{matrix} kp1 & 0 \\ 0 & kpM \end{matrix} \quad (11)$$

By calculating an interference matrix M in accordance with the Equation (10), it is possible to omit the interference matrix creation procedure shown in FIGS. 3(a) and 3(b), thereby greatly decreasing the time required for interference matrix creation.

Embodiment 5

Figure 24:
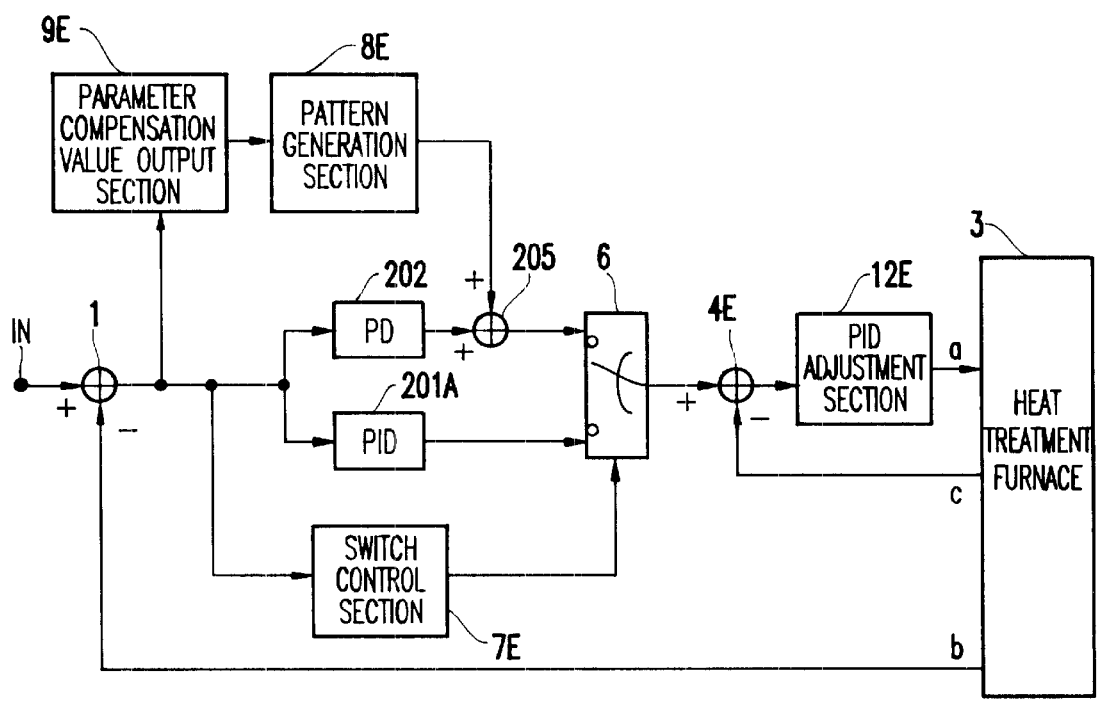
FIG. 24 is a block diagram showing a fifth embodiment.

FIG. 24 is a block diagram showing a fifth embodiment of the invention.

The fifth embodiment is obtained by replacing the I adjustment section 201 of the fourth embodiment with a PID adjustment section 201A.

In the case of the fourth embodiment, the switch element comprising the switcher 203 and the adder 204 is used so that the switcher 203 switches the output of the I adjustment section 201 to the output of the pattern generation section 8E, and the output of the PD adjustment section 202 is then added to the output of the pattern generation section 8E. In the case of the fifth embodiment, however, a switch element comprising a switcher 6 and an adder 205 is used so as to switch over a sum of the output of the pattern generation section 8E and the output of the PD adjustment section 202 to an output of a PID adjustment section 201A.

Embodiment 6

Figure 25:
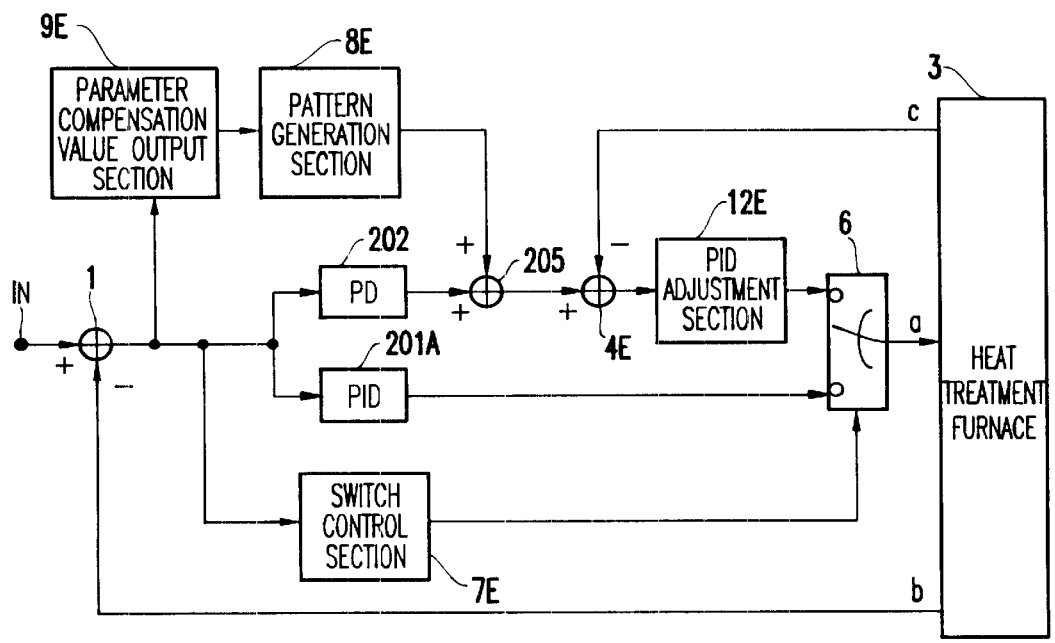
FIG. 25 is a block diagram showing a sixth embodiment.

FIG. 25 is a block diagram showing a sixth embodiment of the invention.

The sixth embodiment comprises a PID adjustment section 201A provided with an I element and a PD adjustment section 202 unprovided with an I element each for receiving a target temperature value of a heat treatment furnace 3 and a first detected temperature value supplied from the heat treatment furnace 3 through an adder 1 to generate a control output, an adder 205 for adding the output of the PD adjustment section 202 and an output of a pattern generation section 8E to each other, an adder 4E for adding the output of the adder 205 and a second detected temperature value supplied from the heat treatment furnace 3, a PID adjustment section 12E to which the output of the adder 4E is inputted, and a switcher 6 for switching over an output of the PID adjustment section 12E and an output of the PID adjustment section 201A.

The above configuration also has the same advantages as those of the embodiments 4 and 5.

Embodiment 7

Figure 26:
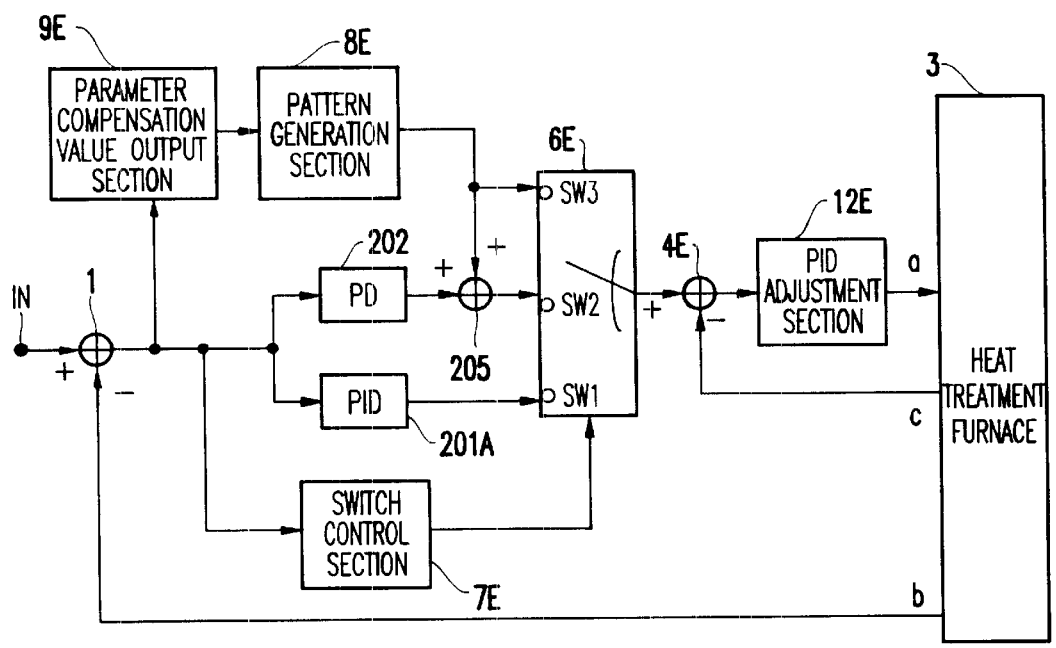
FIG. 26 is a block diagram showing a seventh embodiment.

FIG. 26 is a block diagram showing a seventh embodiment of the invention.

The seventh embodiment comprises a PID adjustment section 201A and a PD adjustment section 202 not provided with an I element each for receiving a target temperature value of a heat treatment furnace 3 and a first detected temperature value supplied from the heat treatment furnace 3 through an adder 1, and a switcher 6E having three switching stages (sw1 to sw3) for switching over between a first output of the PID adjustment section 201A (when switched over to sw1), a second output (when switched over to sw2) in which an output of the PD adjustment section 202 and an output of a pattern generation section 8E are added to each other, and a third output of a pattern generation section 8E (when switched over to sw3).

The seventh embodiment executes temperature control by using the first output of the switcher when a change in the target value (pattern) over time is relatively small, executes temperature control by using the second output of the switcher when a change in the target value (pattern) over time is relatively large, and executes temperature control by using the third output of the switcher in a transient state in which a first condition of a change in the target value (pattern) over time being relatively large shifts to a second condition of a change in the target value (pattern) over time being relatively small (or in a state in which a change rate over time varies).

FIGS. 27(*a*) to 27(*c*) are illustrations showing an operation of the seventh embodiment.

In this embodiment, the invention is directed to temperature control under ramp-up. In a time chart shown in FIG. 27(*c*), temperature control is executed by using the second output of the switcher at the time of ramp-up operation in which a change in the target value over time is relatively large and almost constant (i.e., in a period in which a pattern reaches $YF_i$ from $YI_i$), by using the third output of the switcher in the transient state in which the first condition of a change in the target value (pattern) over time being relatively large shifts to the second condition of a change in the target value (pattern) over time being relatively small (i.e., when or after a pattern reaches $YF_i$ at the end of ramp-up operation, or at or after $t_2$ in FIG. 27(*a*)), and by using the first output of the switcher when a change in the target value over time is relatively small or limited.

According to the above configuration, a differential operation works in addition to a pattern output supplied from the pattern generation section 8E under ramp-up operation, thus improving the response characteristic. Besides, in comparison to the conventional case as shown in FIG. 27(*a*), It is possible to prevent an overshoot by using only the pattern output without the use of the differential operation at the end of ramp-up operation.

Although the pattern in which temperature linearly rises from $YI_1$ up to $YF_i$ and linearly lowers from YFI up to a predetermined time t3 is employed under ramp-up operation as shown in FIG. 27(*c*), it is needless to say that the pattern shown in FIG. 12 in which temperature is leveled after $YF_i$ can also be used.

As shown in FIG. 27(*c*), even when a change in the pattern over time is relatively large, not constant but varying, it is possible to efficiently improve the response characteristic by using only the output of a pattern generation section for a predetermined time after change, As described above, according to the present invention, when a target value for a heat treatment apparatus changes abruptly, an output pattern is set which can make a controlled variable follow the changing target value as quickly as possible, and the output pattern thus set is outputted from a specific point in time as a manipulated variable in place of a PID operational output, whereas when a most portion of a deviation between the controlled variable and the target value has disappeared, the PID operational output is again generated as a manipulated variable. Moreover, the output pattern to be set is beforehand formed into a predetermined formula by the use of a function including a plurality of parameters, which can be updated or compensated for optimization by using an interference matrix. With this configuration, the present invention makes it possible to quickly and accurately change the controlled variable to the target value to thereby make the controlled variable quickly follow the target value, Besides, the controlled variable and target value can be adjusted automatically, thus improving the productivity of a process to a substantial extent.

While the invention has been described in terms of several preferred embodiments, those skilled in the art will recognize that the invention can be practiced with modification within the spirit and scope of the appended claims.

What is claimed is:

1. A semiconductor producing apparatus with a temperature control system, comprising:

an adjuster for receiving the sum of a target value and a detected control value from an adder;

a pattern generator having an approximate function for calculating a pattern output and capable of changing the pattern output in accordance with parameters of said approximate function which change over time; and a switch for switching between one of the output of said pattern generator and an output of said adjuster.

2. The semiconductor producing apparatus according to claim 1, further comprising an external disturbance adjuster for receiving said target value and said detected control value through another adder and generating an output which is to be added to the output of said pattern generator so as to adjust it against an external disturbance.

3. The semiconductor producing apparatus according to claim 1, wherein upon switching of said adjuster, the output of said switch immediately after the switching is adjusted based on the output of said switch immediately before the switching.

4. The semiconductor producing apparatus according to claim 1, wherein said object to be controlled is a temperature in said heat treatment furnace;

in a temperature control process in which the temperature in said heat treatment furnace is raised to a process temperature, said approximate function $f$ of said pattern generator is expressed as follows;

$$f(t-t_0, TI_i, YI_i, YG_i, YF_i)$$

$$= \begin{array}{ll} \text{Max,} & t_0 \le t < t_0 + TI_i \\ YI_i + YG_i \cdot (t - t_0), & t_0 + TI_i \le t < t_2 \\ \text{Min,} & t_2 \le t \end{array}$$

where t is a time variable; $t_0$ is a start time at which said target temperature begins to rise; $t_2$ is a time at which the function $(YI_i + YG_i \cdot (t-t_0))$ reaches $YF_1$; and $TI_i$, $YI_i$, $YG_i$ and $YF_i$ are parameters.

5. The semiconductor producing apparatus according to claim 1, wherein said object to be controlled is a temperature in said heat treatment furnace;

in a temperature control process in which the temperature in said heat treatment furnace is raised to a process temperature, said approximate function $f$ of said pattern generator is expressed as follows;

$$f(t-t_0, YI_i, YG_i, YF_i)$$

$$= \begin{matrix} YI_i + YG_i \cdot (t-t_0), & t_0 \leq t < t_2 \\ YF_i, & t_2 \leq t \end{matrix}$$

where t is a time variable; $t_0$ is a start time at which said target temperature begins to rise; $t_2$ is a time at which the function $(YI_i+YG_i\cdot(t-t_0))$ reaches $YF_i$; and $YI_i$, $YG_i$ and $YF_i$ are parameters.

6. The semiconductor producing apparatus according to claim 1, wherein
said object to be controlled is a temperature in said heat treatment furnace;
in a temperature control process at the time when a boat is loaded into said heat treatment furnace, said approximate function $f$ of said pattern generator is expressed as follows;

$$f(t-t_0, YI_i, YG_i)=YI_i+YG_i\cdot(t-t_0), t_0 \leq t$$

where t is a time variable, $t_0$ is a start time at which said boat begins to be loaded into said furnace; and $YI_i$ and $YG_i$ are parameters.

7. The semiconductor producing apparatus according to claim 1, wherein
said object to be controlled is a temperature in said heat treatment furnace;
in a temperature control process at the time when a boat is loaded into said heat treatment furnace, said approximate function $f$ of said pattern generator is expressed as follows;

$$f(t-t_0, \Delta YI_i, YG_i)=\Delta YI_i+YG_i\cdot(t-t_0)+Y_0, t_0 \leq t, i=1, 2\ldots, M$$

where t is a time variable; $t_0$ is a start time at which said boat begins to be loaded into said furnace; $\Delta YI_i$ is a difference between $Y_{1\ and\ Y0}$ upon switching; and $Y_0$ is an output value of said first adjuster upon switching.

8. The semiconductor producing apparatus according to claim 1, wherein said object to be controlled is a temperature in said heat treatment furnace;
in a temperature control process in which the temperature in said heat treatment furnace is raised to a process temperature, said approximate function of said pattern generator is expressed as follows;

$$f(t-t_0, \Delta YI_i, YG_i, \Delta YF_i)$$

$$= \begin{matrix} \Delta YI_i + YG_i \cdot (t-t_0) + Y_0, & t_0 \leq t < t_2 \\ \Delta YF_i + Y_0, & t_2 \leq t \end{matrix}$$

where t is a time variable; $t_0$ is a start time at Which said target temperature begins to rise; $t_2$ is a time at which the function $(YI_i+YG_i\cdot(t-t_0))$ reaches $YF_1$; $\Delta YI_i$ is a difference between $YI_i$ and $Y_0$); $\Delta YF_i$ is a difference between $YF_i$ and $Y_0$; and $Y_0$ is an output value of said first adjuster upon switching.

9. A semiconductor producing apparatus with a temperature control system, comprising:
an adjuster provided with an integrating adjusting section for receiving the sum of a target value and a detected control value from an adder;
a pattern generator having an approximate function for calculating a pattern output and capable of changing the pattern output in accordance with parameters of said approximate function which change over time; and
a switch for switching between one of the output of said pattern generator and an output of said adjuster including said integrating adjusting section.

10. A semiconductor producing apparatus with a temperature control system, comprising:
a first adjuster for receiving the sum of a target temperature value of a heat treatment furnace and a first detected temperature value from said heat treatment furnace from an adder;
a pattern generator having an approximate function for calculating a pattern output and capable of changing the pattern output in accordance with parameters of said approximate function which change over time; and
a switch for switching between one of the output of said pattern generator and an output of said first adjuster to generate an output as a manipulated variable to said heat treatment furnace.

11. The semiconductor producing apparatus according to claim 10, wherein the first detected temperature value is an average value obtained by averaging temperature values detected at a plurality of locations of an object to be controlled with a predetermined ratio.

12. The semiconductor producing apparatus according to claim 10, further comprising a parameter compensator for generating a compensation value which is used for compensating the parameters of said approximate function of said pattern generator based on the first detected temperature value.

13. The semiconductor producing apparatus according to claim 12, wherein said parameter compensator sets an evaluation value E having a correlation with the parameters of said approximate function and evaluating whether the temperature control is good or bad, previously determines an interference matrix M ($M\times\Delta P=\Delta E$) representative of a relation between a minimal change $\Delta P$ of a parameter P and a minimal change $\Delta E$ of said evaluation value E which is caused by the minimal change $\Delta P$ given to said parameter P, and calculates, as a parameter compensation value, such an amount of change of said parameter P as to make said evaluation value E to be a desired value by using said interference matrix M.

14. The semiconductor producing apparatus according to claim 10, further comprising a parameter compensator for generating a compensation value which is used for compensating the parameters of said approximate function of said pattern generator based on the first detected temperature value,
wherein said parameter compensator has an interference matrix M for calculating, as a parameter compensation value, such an amount of change in a parameter as to make said evaluation value to be a desired value, said interference matrix having, as its factors, transfer gains each representative of a relation between a manipulated variable to said heat treatment furnace and the detected temperature value from said heat treatment furnace, whereby said parameter is compensated by the parameter compensation value thus obtained, so that said pattern generator generates a functional output by use of the compensated parameter, said switch being operable to select the output of said adjuster when a change of said target value over time is relatively limited, and the output of said pattern generator when a change in said target value over time is relatively great, so as to use it for control operation.

15. The semiconductor producing apparatus according to claim 10, wherein when the output of said switch is switched over from the output of said first adjuster into the output of said pattern generator, the output of said pattern generator is adjusted in accordance with the output of said first adjuster immediately before the switching.

16. A semiconductor producing apparatus with a temperature control system, comprising:
- a first adjuster for receiving, from a first adder, the sum of a target temperature value of a heat treatment furnace and a first detected temperature value from said heat treatment furnace;
- a pattern generator having an approximate function for calculating a pattern output and capable of changing the pattern output in accordance with parameters of said approximate function which change over time;
- a switch for switching between one of the output of said pattern generator and an output of said first adjuster; and
- a second adjuster provided at an output side of said switch for receiving, from a second adder, the sum of the output of said switch and a second detected temperature value from said heat treatment furnace and for generating an output as a manipulated variable to said heat treatment furnace.

17. A semiconductor producing apparatus with a temperature control system comprising:
- a first adjuster for receiving, from a first adder, the sum of a target temperature value of a heat treatment furnace and a first detected temperature value from said heat treatment furnace;
- a pattern generator having an approximate function for calculating a pattern output and capable of changing the pattern output in accordance with parameters of said approximate function which change over time;
- a second adjuster for receiving, from a second adder, the sum of the output of said pattern generator and a second detected temperature value from said heat treatment furnace; and
- a switch for switching between one of an output of said second adjuster and an output of said first adjuster to generate an output as a manipulated variable to said heat treatment furnace.

18. The semiconductor producing apparatus according to claim 17, wherein when the output of said adjuster is switched over from the output of said first adjuster into the output of said second adjuster, the output of said pattern generator is adjusted in accordance with the output of said second detected temperature value immediately before the switching.

19. A semiconductor producing apparatus with a temperature control system, comprising:
- a first adjuster provided with an integrating element and a second adjuster without an integrating element each for receiving, from a first adder, the sum of a target temperature value of a heat treatment furnace and a first detected temperature value from said heat treatment furnace;
- a pattern generator having an approximate function for calculating a pattern output and capable of changing the pattern output in accordance with parameters of said approximate function which change over time;
- a switch for switching between one of an output of said first adjuster and a sum of the output of the pattern generator and an output of said second adjuster; and
- a third adjuster for receiving, from a second adder, the output of said switch and a second detected temperature value from said heat treatment furnace and generating a manipulated variable to said heat treatment furnace.

20. The semiconductor producing apparatus according to claim 19, wherein said second adjuster without an integrating element comprises a PD adjuster, and said first adjuster provided with an integrating element comprises an adjuster including a PID factor or a PI factor or an adjuster including an integrating element alone.

21. The semiconductor producing apparatus according to claim 19, further comprising a parameter compensator for generating a compensation value which is used for compensating the parameters of said approximate function of said pattern generator based on the first detected temperature value;
- wherein said parameter compensator has an interference matrix M for calculating, as a parameter compensation value, such an amount of change in a parameter as to make an evaluation value E, which has a correlation with said parameter, to be a desired value;
- said interference matrix M is calculated by the following formula;

$$M=(Eu+G \times Kp)^{-1} \times G$$

where G is a matrix having, as its factors, transfer gains each representative of a relation between a manipulated variable to said heat treatment furnace and the detected temperature value from said heat treatment furnace; and Kp is a diagonal matrix having, as its diagonal factors, constants of a P factor of said fourth adjuster inclusive of no integral factor; and Eu is an unit matrix;
- said parameter is compensated by the parameter compensation value thus obtained, so that said pattern generator generates a functional output by use of the compensated parameter; and
- said switch is operated to select the output of said adjuster when a change of said target value over time is relatively limited, and the output of said pattern generator when a change in said target value over time is relatively great, so as to use it for control operation.

22. A semiconductor producing apparatus with a temperature control system, comprising:
- a first adjuster provided with an integrating element and second adjuster without an integrating element each for receiving, from a first adder, the sum of a target temperature value of a heat treatment furnace and a first detected temperature value from said heat treatment furnace to generate an adjuster output;
- a pattern generator having an approximate function for calculating a pattern output and capable of changing the pattern output in accordance with parameters of said approximate function which change over time;
- a third adjuster for receiving, from a second adder, a sum of an output of said second adjuster and the output of said pattern generator, and a second detected temperature value from said heat treatment furnace; and
- a switch for switching between an output of said first adjuster and an output of said third adjuster to generate an output as a manipulated variable to said heat treatment furnace.

23. A semiconductor producing apparatus with a temperature control system, comprising:
- a first adjuster provided with an integrating element and a second adjuster without an integrating element each for receiving, from a first adder, the sum of a target temperature value of a heat treatment furnace and a first detected temperature value from said heat treatment furnace;

a pattern generator having an approximate function for calculating a pattern output and capable of changing the pattern output in accordance with parameters of said approximate function which change over time;

a switch for switching among one of an output of said first adjuster, a sum of an output of said second adjuster and the output of said pattern generator, and the output of the pattern generator; and a third adjuster for receiving, from a second adder, the sum of the output of said switch and a second detected temperature value from said heat treatment furnace and generating an output as a manipulated variable to said heat treatment furnace.

24. A temperature control method for a semiconductor producing apparatus with a temperature control system, comprising:

receiving the sum of a target temperature value of a heat treatment furnace and a first detected temperature value from said heat treatment furnace from an adder in a first adjuster;

calculating a pattern output, wherein the pattern output changes in accordance with parameters of an approximate function;

switching between one of the pattern output and an output of said first adjuster to generate an output as a manipulated variable to said heat treatment furnace;

generating a compensation value based upon an interference matrix including an evaluation value E have a correlation with the parameters of said approximate function, wherein said compensation value is an amount of change of a parameter P to make said evaluation value E to be a desired value using said interference matrix; and generating a compensation value which is used for compensating the parameters of said approximate function based on a first detected temperature value, wherein determining said interference matrix M (M×ΔP= ΔE) representative of a relation between a minimal change ΔP of a parameter P and a minimal change ΔE of said evaluation value E which is caused by the minimal change ΔP given to said parameter P, wherein upon determining said interference matrix, carrying out a heat treatment to obtain a first evaluation value for a prescribed evaluation item with a specified parameter being temporally set to a first value, then another heat treatment is carried out to obtain a second evaluation value for said prescribed evaluation item with said specified parameter being temporally set to a second value, and a interference matrix is previously calculated based on the temporally set first and second values and said first and second evaluation values;

upon compensating said specified parameter, determining a third evaluation value by effecting a further heat treatment after determining said interference matrix, so that a compensated value of said specified parameter is calculated based on a difference between the thus determined third evaluation value and a desired evaluation value using said interference matrix to thereby compensate said specified parameter, and generating, a functional output using said compensated specified parameter; and upon performing temperature control, in the case where a change in said target value over time is relatively limited, selecting the output of said adjuster for use with control operation, whereas in the case where a change over time of said target value is relatively large, the output of said pattern generator is selected for use with control operation.

25. A method for producing a semiconductor device by using the temperature control method for a semiconductor producing apparatus as defined in claim 24.

26. A temperature control method for the semiconductor producing apparatus with a temperature control system, comprising:

receiving the sum of a target temperature value of a heat treatment furnace and a first detected temperature value from said heat treatment furnace from an adder in a first adjuster;

calculating a pattern output, wherein the pattern output changes in accordance with parameters of an approximate function;

switching between one of the pattern output and an output of said first adjuster to generate an output as a manipulated variable to said heat treatment furnace;

generating a compensation value based upon an interference matrix including an evaluation value E have a correlation with the parameters of said approximate function, wherein said compensation value is an amount of change of a parameter P to make said evaluation value E to be a desired value using said interference matrix; and generating a compensation value which is used for compensating the parameters of said approximate function based on a first detected temperature value, wherein determining said interference matrix M (M×ΔP= ΔE) representative of a relation between a minimal change ΔP of a parameter P and a minimal change ΔE of said evaluation value E which is caused by the minimal change ΔP given to said parameter P, wherein said compensated specified parameter is further compensated based on a difference between an actually measured evaluation value obtained upon the heat treatment using said compensated parameter and a desired evaluation value.

27. A temperature control method for the semiconductor producing apparatus with a temperature control system, comprising:

receiving the sum of a target value and a detected control value from an adder in an adjuster;

calculating a pattern output, wherein the pattern output changes in accordance with parameters of an approximate function;

switching between one of the pattern output and an output of said adjuster;

wherein the pattern output of said function is previously calculated and stored.

28. A temperature control method for the semiconductor producing apparatus with a temperature control system, comprising:

receiving the sum of a target value and a detected control value from an adder in an adjuster;

calculating a pattern output, wherein the pattern output changes in accordance with parameters of an approximate function;

switching between one of the pattern output and an output of said adjuster; and wherein the output of said adjuster is selected when a change in said target value over time is relatively limited, whereas the pattern output is selected when a change in said target value over time is relatively great.

29. A temperature control method for the semiconductor producing apparatus with a temperature control system, comprising:

receiving the sum of a target value and a detected control value from an adder in an adjuster having integrating adjusting section;

calculating a pattern output, wherein the pattern output changes in accordance with parameters of an approximate function;

switching between one of the pattern output and an output of said adjuster; and wherein the output of at least said integrating adjusting section of said adjuster is selected when a change in said target value over time is relatively limited, whereas the pattern output is selected when a change in said target value over time is relatively great.

30. A temperature control method for the semiconductor producing apparatus with a temperature control system, comprising:

receiving the sum of a target temperature value of a heat treatment furnace and a first detected temperature value from said heat treatment furnace from an adder in an adjuster;

calculating a pattern output, wherein the pattern output changes in accordance with parameters of an approximate function;

switching between one of the pattern output and an output of said first adjuster to generate an output as a manipulated variable to said heat treatment furnace; and wherein said first adjuster includes an integrating adjusting section; and the output of at least said integrating adjusting section of said adjuster is selected when a change in said target value over time is relatively limited, whereas the pattern output is selected when a change in said target value over time is relatively great.

31. The temperature control method for a semiconductor producing apparatus as defined in claim 30, wherein in a parameter compensator is provided for generating a compensation value for compensating the parameters of an approximate function of said pattern generator based on said detected control value.

32. A temperature control method for a semiconductor producing apparatus including:

receiving from a first adder, the sum of a target temperature value of a heat treatment furnace and a first detected temperature value from said heat treatment furnace in each of a first adjuster provided with an integrating element and a second adjuster without an integrating element;

calculating a pattern output wherein the pattern output changes in accordance with parameters of an approximate function which change over time;

switching between one of a first output of said first adjuster, a second output in the form of a sum of an output of said second adjuster and the pattern output, and said pattern output;

wherein the first output is selected to carry out temperature control when a change in said target value over time is relatively limited, said second output is selected to carry out temperature control when a change in said target value over time is relatively great, and said pattern output is selected to carry out temperature control in a transient period in which a change in said target value over time transfers from a relatively great state to a relatively limited state.

33. The temperature control method for a semiconductor producing apparatus as defined in claim 32, wherein the state of a change in said target value over time being relatively great is a ramp-up period, and said transient period of a change in said target value over time transferring from a relatively great state into a relatively limited state is an end point of the lamp-up period.

* * * * *

UNITED STATES PATENT AND TRADEMARK OFFICE
CERTIFICATE OF CORRECTION

PATENT NO.   : 6,496,749 B1
DATED        : December 17, 2002
INVENTOR(S)  : Hideto Yamaguchi, Kazuo Tanaka and Kenzo Urabe It is certified that error appears in the above-identified patent and that said Letters Patent is hereby corrected as shown below:

Column 38,
Line 4, please change claim 25 to:

25. A method for producing a semiconductor device by using the temperature control method for a semiconductor producing apparatus as defined in claim 27.

Signed and Sealed this

Seventeenth Day of June, 2003

JAMES E. ROGAN
*Director of the United States Patent and Trademark Office*